(12) United States Patent
Knusen

(10) Patent No.: US 6,232,897 B1
(45) Date of Patent: *May 15, 2001

(54) SYSTEM AND METHOD FOR CALIBRATING AN ANALOG TO DIGITAL CONVERTER THROUGH STIMULATION OF CURRENT GENERATORS

(75) Inventor: Niels Knusen, Humlebaek (DK)

(73) Assignee: National Instruments Corporation, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/351,759

(22) Filed: Jul. 12, 1999

(51) Int. Cl.$^7$ ..................................................... H03M 1/06
(52) U.S. Cl. ............................................ 341/120; 341/162
(58) Field of Search .................................. 341/118, 120, 341/143, 162, 163

(56) References Cited

U.S. PATENT DOCUMENTS

| | | | |
|---|---|---|---|
| 4,354,177 | * 10/1982 | Sloane | 340/347 |
| 4,791,406 | * 12/1988 | Mehrgardt et al. | 341/144 |
| 4,897,650 | * 1/1990 | Shott, III et al. | 341/120 |
| 5,305,004 | * 4/1994 | Fattaruso | 341/120 |
| 5,406,283 | * 4/1995 | Leung | 341/143 |
| 5,781,137 | * 7/1998 | Knudsen | 341/118 |
| 5,781,138 | 7/1998 | Knudsen | 341/143 |
| 5,861,826 | * 1/1999 | Shu et al. | 341/120 |
| 5,982,313 | * 11/1999 | Brooks et al. | 341/143 |
| 6,016,112 | 1/2000 | Knudsen | 341/118 |
| 6,020,838 | 2/2000 | Knudsen et al. | 341/143 |
| 6,049,298 | 4/2000 | Knudsen | 341/118 |

OTHER PUBLICATIONS

IEEE Press, Delta–Sigma ADCs with Multibit Internal Converters, Richard L. Carley et al., 1997, Chapter 8, pp. 244–281.

Digitally Corrected Multi–Bit $\Sigma\Delta$ Data Converters, Cataltepe et al, 1991, pp. 192–195.

* cited by examiner

Primary Examiner—Michael Tokar
Assistant Examiner—James H. Cho
(74) Attorney, Agent, or Firm—Conley Rose & Tayon PC; Jeffrey C. Hood

(57) ABSTRACT

A system and method for calibrating an analog to digital (A/D) converter. The A/D converter includes an internal D/A converter, wherein the internal D/A converter includes a plurality of current generators, and wherein one or more of the current generators may produce linearity errors in the A/D converter. The A/D converter includes a switching element connected to the internal D/A converter. During calibration, the switching element operates to adjust connections to the current generators in the internal D/A converter one or more times according to different switching patterns, thereby causing different ones of the current generators to be stimulated by an input to the A/D converter. This avoids the necessity of using a complex and costly waveform generator input during calibration, which would normally be required to ensure that all of the current generators in the internal D/A converter are stimulated. Rather, a much simpler input can be used in calibrating the A/D converter, thereby reducing cost. A plurality of output digital signals from the A/D converter are recorded during calibration, wherein these recorded signals contain linearity error information associated with the respective current generators. This linearity error information may be extracted and used in calibrating the A/D converter.

48 Claims, 13 Drawing Sheets

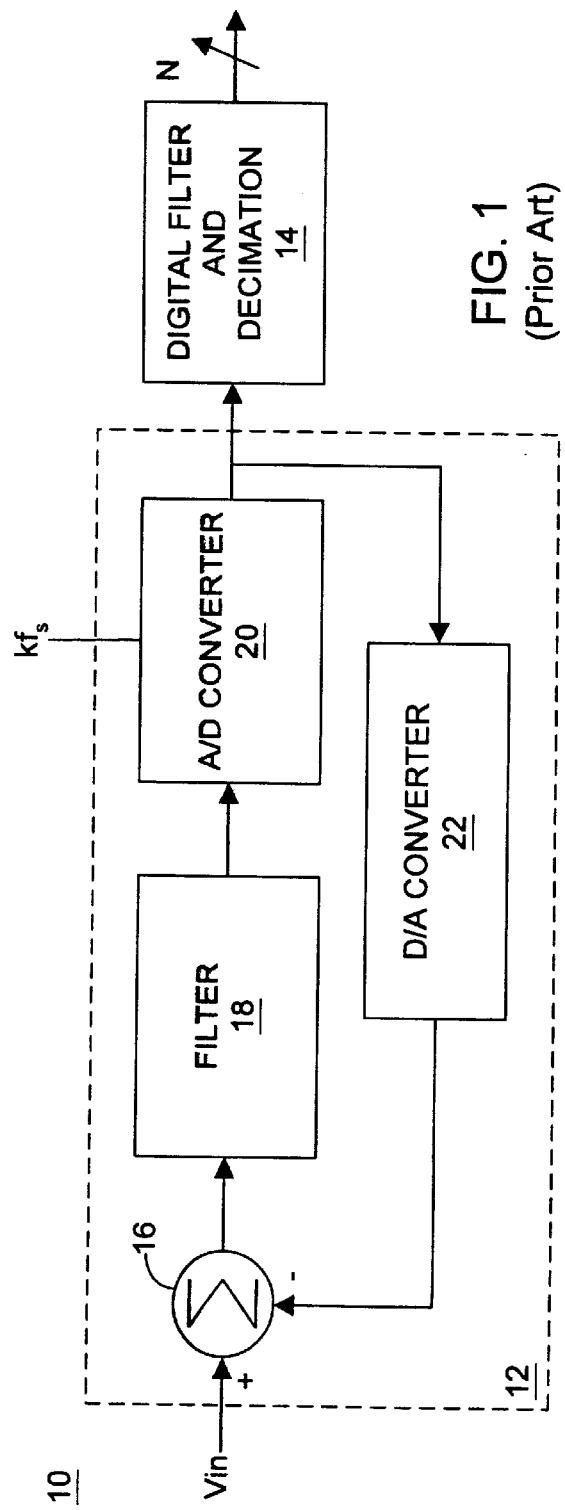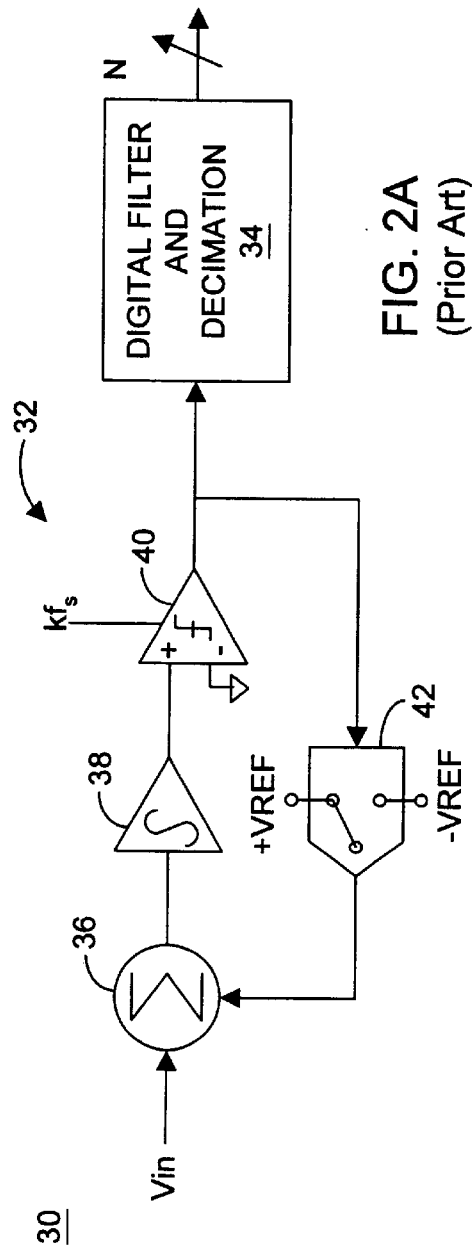
FIG. 1 (Prior Art)
FIG. 2A (Prior Art)

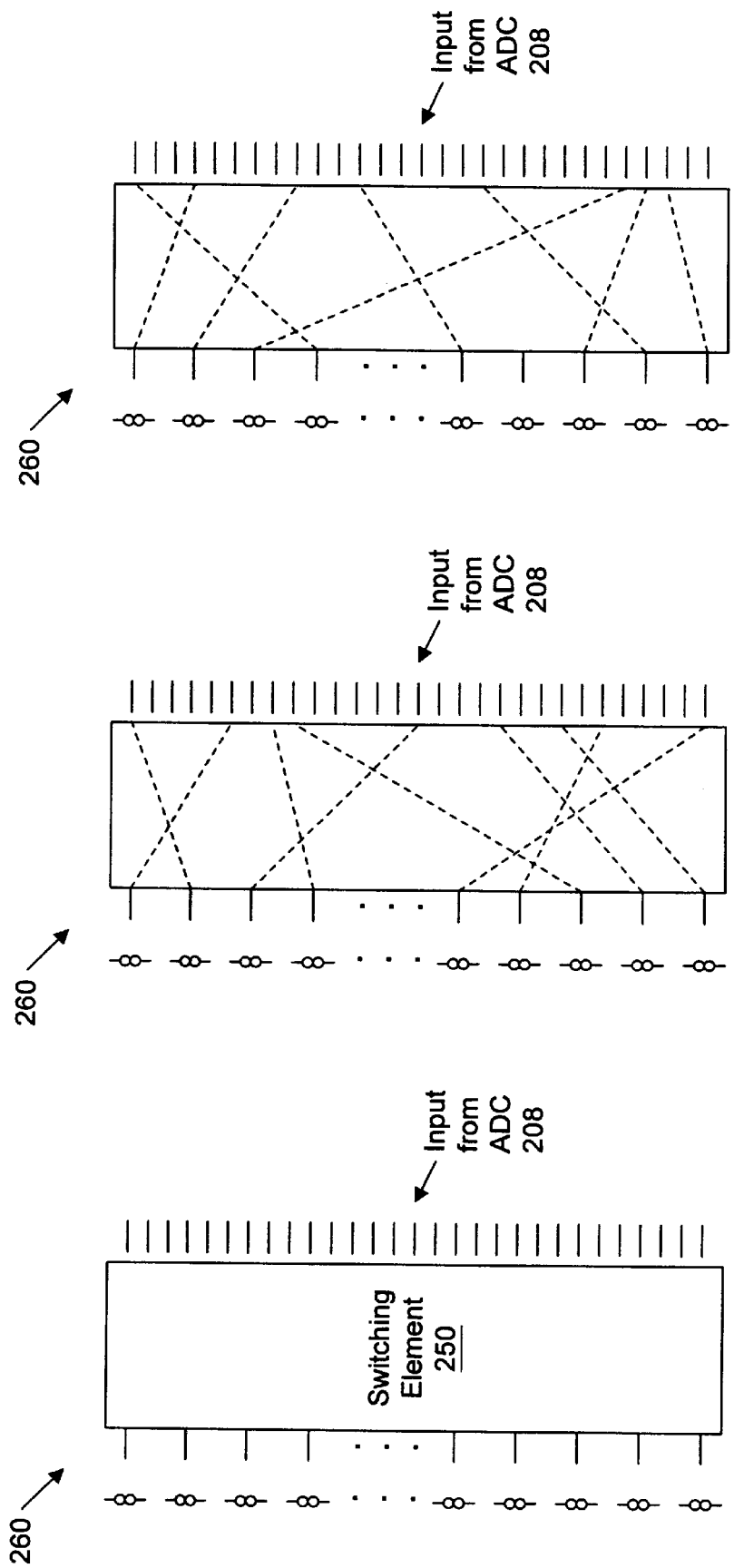

SYSTEM AND METHOD FOR CALIBRATING AN ANALOG TO DIGITAL CONVERTER THROUGH STIMULATION OF CURRENT GENERATORS

FIELD OF THE INVENTION

This invention relates to the art of analog-to-digital (A/D) converters, and more particularly, to A/D converters which include linearity errors.

DESCRIPTION OF THE RELATED ART

Analog-to-digital converters (ADCs) are circuits used to convert signals from the analog domain, where the signals are represented by continuous quantities such as voltage and current, to the digital domain, where the signals are represented by numbers. These circuits can be implemented in a large number of ways. Established A/D conversion techniques include flash, delta-sigma (or sigma-delta), sub-ranging, successive approximation, and integrating.

One example of an A/D converter is an over-sampled A/D converter. Oversampled A/D converters, often denoted as "delta-sigma converters" or "sigma-delta converters" are well known in the art. Delta-sigma (D/S) converters have gained in popularity due primarily to their ability to realize high resolution analog-to-digital conversion in mixed signal VLSI processors.

A D/S converter essentially digitizes an analog signal at a very high sampling rate (oversampling) in order to perform a noise shaping function. Digital filtering after the noise shaping allows the D/S converter to achieve a high resolution when compared with conventional A/D converters. Decimation is thereafter used to reduce the effective sampling rate back to the "Nyquist" rate. To gain an understanding of D/S converters, it is important to understand the operation of oversampling, noise shaping, digital filtering and decimation, the key concepts involved.

FIG. 1 shows, in block diagram form, a single bit D/S converter 10 commonly known in the art. The single bit D/S converter 10 includes a single bit D/S modulator 12 connected to a digital filter and decimation circuit 14. The D/S modulator 12 includes a summing node 16, a filter 18, a single bit A/D converter 20, and a single bit D/A converter 22. The D/A converter 22 is connected to the output of the A/D converter 20 and operates to provide feedback to the summing node 16. The summing node 16 includes a pair of inputs, one being connected to the analog input signal $V_{in}$ and the other being connected to the output of the D/A converter 22.

In operation, the output of summing node 16 is low-pass filtered by filter 18 and subsequently converted into a single bit, digital signal by A/D converter 20. The single bit digital signal in turn is converted back into an analog signal by D/A converter 22 and subtracted from analog input signal $V_{in}$ at summing node 16.

The single bit D/S modulator 12 converts the input signal $V_{in}$ into a continuous serial stream of 1s and 0s at a rate determined by sampling clock frequency, $kf_s$. Due to the feedback provided by the D/A converter 22 the average value output by the D/A converter 22 approaches that of the input signal $V_{in}$ if the loop has enough gain.

FIG. 2A shows a schematic implementation of the single bit D/S converter of FIG. 1. In particular, FIG. 2A shows a single bit D/S converter 30 which includes a single bit D/S modulator 32 connected to a digital filter and decimation circuit 34. The single bit D/S modulator 32 includes a summing node 36, an integrator 38, a latched comparator 40 which functions as the single bit A/D converter, and a simple switching mode device 42 which finctions as the single bit D/A converter.

Integrator 38 acts as a filter and has an amplitude response in the frequency domain proportional to 1/f, where f is the input frequency. Since the chopper like action of the clocked, latched comparator 40 converts the input signal to a high frequency AC signal, varying about the average value of the input $V_{in}$, the effective quantization noise at low frequencies is greatly reduced. In effect, low frequency quantization noise is "shaped" into higher frequencies. FIG. 2B shows the simulated noise density as a function of frequency of a D/S modulator. The y-axis is in dB and the x axis is in MHz. As can be seen, the lower noise frequencies are attenuated. The exact frequency spectrum of the resulting noise shaping depends on the sampling rate, the integrator time constant, and the order of the filter.

Clearly, a single bit, digital representation of an analog signal has very little resolution. The D/S modulator 32 of FIG. 2A is very difficult to analyze in the time domain because of the apparent randomness of the single bit nature of the data. For any given input value in a single sampling interval, data from the latched comparator 40 is virtually meaningless. A meaningful value results only when a large number of samples are averaged. If the input signal $V_{in}$ is near positive full scale, it is clear that there will be more 1s than 0s in the bit stream. Likewise, for signals near the negative full scale, there will be more 0s than is in the bit stream. For input signals near the midscale, there will be approximately an equal number of 1s and 0s.

After the quantization noise has been shaped by the D/S modulator 32, the output of the D/S converter 30 is further processed by the digital filter and decimator circuit 34. The purpose of the digital filter is two fold. First, the digital filter acts as an anti-aliasing filter with respect to the final sampling rate, fs. Second, the digital filter filters out the higher frequency noise produced by the noise shaping process of the D/S modulator 32. Final data reduction is performed by digitally resampling the filtered output using a process called decimation. Decimation is the process of resampling at a lower rate. Decimation can be viewed as the method by which redundant signal information introduced by the oversampling process is removed.

FIG. 3 shows a multi-bit D/S converter 50 in block diagram form. The multi-bit D/S converter 50 includes a multi-bit D/S modulator 52 connected to a multi-bit digital filter and decimation circuit 54. The multi-bit D/S modulator 52 further includes a summing node 56, a filter 58, a multi-bit AID converter 60, and a multi-bit internal D/A converter 62.

The multi-bit D/S modulator 50 of FIG. 3 operates similarly to the single-bit D/S converter of FIG. 1. The output of the summing node 56 is low-pass filtered by filter 58 and converted into a multi-bit digital signal by multi-bit internal A/D converter 60 operating at oversampling rate $kf_s$. The multi-bit D/A converter 62 is connected via a feedback loop between the output of the multi-bit A/D converter 60 and an input node of the summing node 56, whereby the analog signal output of the D/A converter 62 is subtracted from the analog signal input $V_{in}$. Again, the output of D/A converter 62 approaches that of the analog input signal $V_{in}$ due to the feedback involved. Digital filter and decimation circuit 54 removes quantization noise shaped into the higher frequencies and resamples the oversampled digital signal at rate $f_s$.

The multi-bit D/S converter 50 of FIG. 3 provides benefits over the single bit D/S converter 10 of FIG. 1. Namely, the multi-bit D/S converter 50 provides more resolution and less quantization noise. Additionally, the multi-bit D/S converter 50 is more stable than single bit D/S converters. However, the multi-bit D/S converter suffers from linearity errors introduced by the internal multi-bit D/A converter 62. Single bit D/S converters on the other hand do not produce linearity errors.

Linearity error is the inability of the multi-bit D/A converter to accurately translate a digital input value into an analog current or voltage. In other words, given a particular digital input, the resulting analog output of the multi-bit internal D/A converter 62 approximates the digital value but is not exactly equal to the digital value. In reality, the actual analog output differs from the digital input value by an amount equal to the linearity error.

FIG. 4 shows a graphical comparison of an ideal linear vs. non-ideal, non-linear multi-bit D/A converter. The horizontal axis represents the codes or multi-bit digital signals applied to the inputs of both types of multi-bit D/A converters, ideal and non-ideal. The vertical axis represents the analog signal output therefrom. Line L represents the transfer function of the ideal or linear D/A converter. Line NL represents the transfer function of the non-ideal or non-linear D/A converter. Variations between the two lines represent the linearity errors. The distance between points on a vertical line through both line L and the line NL represent the linearity error produced by the non-ideal D/A converter for a particular input code. For example, if digital code x is input to both the ideal D/A converter and the non-ideal D/A converter, the respective outputs would be YL and $Y_{NL}$. The difference in voltage $\Delta Y$ represents the linearity error corresponding to digital code x. This linearity error is viewed as noise and degrades the ultimate signal to noise ratio of the D/S converter which contains the non-linear D/A converter. This linearity error is static in nature and independent of frequency and voltage.

The source of linearity errors can be traced to the internal current generators of the multi-bit D/A converter. FIG. 5 shows, in schematic form, a simplified D/A converter 70 employing a number of internal current generators 72. Each of the internal current generators 72 is selectively connected to an output node 74 via switches 76. Each switch 76 contains an input configured to receive one bit of the digital code inputted to the D/A converter 70. For example, switch $S_{N-1}$ is controlled by the most significant bit of the input digital code. When the most significant bit is 1, the associated current generator is connected to summing node 74. Thus, given a particular digital input code, the output of one or more of the current generators 72 is connected to the summing node 74.

If the D/A converter 70 was ideal and contained ideal current generators, current would be generated therefrom in integer units. For example, if the D/A converter 70 of FIG. 5 was an ideal 3 bit D/A converter, and a digital code inputted thereto equaled 111, the three ideal internal current generators 72 would generate 4, 2, and 1 units of current, respectively. However, internal current generators are rarely ideal. Given an input code 111, the non-ideal set of current generators, for example, might generate 4.05, 1.98, and 1.01 units of current, respectively.

The linearity error produced by the internal current generators can be further traced to a variety of causes, chief of which is the inability of integrated circuit manufacturers to form, in silicon, current generators having identical geometries. Several other causes can be related to the linearity error. Over time and use, the internal current generators may wear differently. Moreover, temperature variations may occur between the internal current generators. In any event, the physical differences between internal current generators in a D/A converter, even though slight, can produce significant errors in the translation of a digital input code into an analog equivalent.

Single bit D/A converters do not employ multiple current generators. As such, single bit D/A converters do not exhibit the non-linearity characteristics of multi-bit D/A converters. Accordingly, single bit D/S converters employing a single bit internal D/A converter, such as shown in FIG. 1, do not suffer from linearity errors. To this end, single bit D/S converters are advantageous over multi-bit D/S converters. Thus, while it is known that the resolution and stability of a multi-bit D/S converter is superior to that of a single bit D/S converter, single bit D/S converters are superior to multi-bit D/S converters to the extent that a single bit D/S converter produces less linearity error when compared to the linearity error produced by the multi-bit D/S converter. If it were not for the linearity errors caused by the internal multi-bit D/A converter, designers would generally prefer to use multi-bit D/S converters over single bit D/S converters.

It is desirable to have a multi-bit D/S converter in which the non-linearity produced by the internal D/A converter is removed or otherwise reduced.

U.S. Pat. Nos. 5,781,137 and 5,781,138 describe a system and method which operate to calibrate the A/D converter to eliminate or otherwise reduce linearity errors in the multi-bit A/D converter. The technique disclosed in these patents includes applying a known analog waveform, preferably a pure sine wave, to an input of the A/D converter, or to a portion of the A/D converter, and generating digital signals representative of the pure sine wave. A number of the digital signals output from the converter are recorded. These recorded digital signals contain hidden information regarding the linearity errors associated with the A/D converter. The linearity error information can be extracted and used in deriving correction coefficients and constructing a linearity error correction circuit. The linearity error correction circuit then can be used to correct for linearity errors in the A/D converter.

The system and method described in the above patents utilize a waveform generator to provide an analog waveform signal to the A/D converter. The analog waveform is used to stimulate each of the current generators of the A/D converter in order to gather linearity error information about each of the current generators. In the embodiment described in the above patents, a sine wave generator is used to provide a sine wave signal to the A/D converter. However, a waveform generator is an expensive component, adding cost and reducing board area for other devices. Therefore, a system and method is desired for calibrating an A/D converter without requiring use of a waveform generator.

SUMMARY OF THE INVENTION

The present invention comprises a system and method for calibrating an analog to digital (A/D) converter without requiring use of a waveform generator. The present invention thus provides an improved A/D converter with reduced cost.

The present invention is preferably comprised in a computer-based data acquisition (DAQ) system, the system comprising a computer system and a DAQ device comprised in or coupled to the computer system. The DAQ device includes the A/D converter according to the present invention. The present invention may be used with any of various types of A/D converters, including integrating A/D converters, flash A/D converters, sigma-delta A/D converters, sub-ranging A/D converters, and successive approximation A/D converters, among others. The A/D converter includes, for example, one or more internal digital to analog (D/A) converters which may generate linearity errors.

In the preferred embodiment, in performing the calibration technique, a constant analog signal, such as a logical ground, or no input signal, is applied to the A/D converter, and the resulting output of the A/D converter is recorded. The A/D converter includes a switching element according to the present invention. The switching element may be comprised in the internal D/A converter of the A/D converter. During this recording, the switching element operates to change the manner in which the internal D/A converter decodes the received digital signal one or more times. The switching element may operate a plurality of times using different switching patterns. Each of the switching patterns involve different connections between the inputs of the internal D/A converter and the respective current generators. Thus the plurality of different switching patterns ensure that a majority or all of the current generators within the D/A converter are toggled or stimulated by the constant analog input signal. The recorded digital signals thus contain hidden information regarding the linearity errors associated with a majority or all of the current generators in the internal D/A converter. This linearity error information is then used in calibrating the A/D converter.

Thus, instead of applying a known analog waveform, e.g., a pure sine wave, to an input of the A/D converter, or to a portion of the A/D converter, and generating digital signals representative of the pure sine wave, a much simpler input, such as a constant input, e.g., a logical ground, or no input, may be applied to the A/D converter. As discussed above, one problem in applying a constant or zero input is that not all of the current generators in the D/A converter of the A/D converter are necessarily stimulated. The switching element according to the present invention utilizes different switching patterns to change the manner in which the D/A converter decodes the received digital signal. Thus the digital signals generated in response to zero input carry linearity error information on most or all of the current generators in the D/A converter.

The linearity error information may then be extracted and used in calibrating the A/D converter. In the preferred embodiment, a constant input, or no input, is applied, and the method records the output digital signals using the switching technique described above. The method also records the different switching patterns used for each recorded sample. The switching patterns provide an indication of which current generator was stimulated for each output digital signal or sample. The method then removes high frequency noise from the recorded digital signals. The recorded digital signals (with high frequency noise removed) have a frequency band where zero energy is expected, and any signal content present in this band contains hidden linearity error information. The method then operates to extract linearity error information from the recorded digital signals, using the switching patterns to indicate which current generator was stimulated for each output digital signal.

The linearity error information can be extracted and used in deriving the correction coefficients and constructing the linearity error correction circuit. In the preferred embodiment, the host computer system preferably includes software which receives the recorded signals and operates to extract the linearity error information and derive the correction coefficients. Alternatively, this operation can be performed by logic comprised on the A/D device or DAQ device.

BRIEF DESCRIPTION OF THE DRAWINGS

A better understanding of the present invention can be obtained when the following detailed description of the preferred embodiment is considered in conjunction with the following drawings, in which:

FIG. 1 represents a prior art single bit D/S converter in block form;

FIG. 2A represents a prior art single bit D/S converter in schematic form;

FIG. 9 is a block diagram illustrating the DAQ card comprised in the system of FIG. 7, wherein the DAQ card includes a multi-bit A/D converter employing the present invention, and wherein FIG. 9 illustrates normal acquisition operation;

FIG. 11 illustrates the switching element of the present invention;

FIG. 11A illustrates an example of the switching element providing bits to the current generators according to a first switching pattern;

FIG. 11B illustrates an example of the switching element providing bits to the current generators according to a second switching pattern;

Figure 2B:
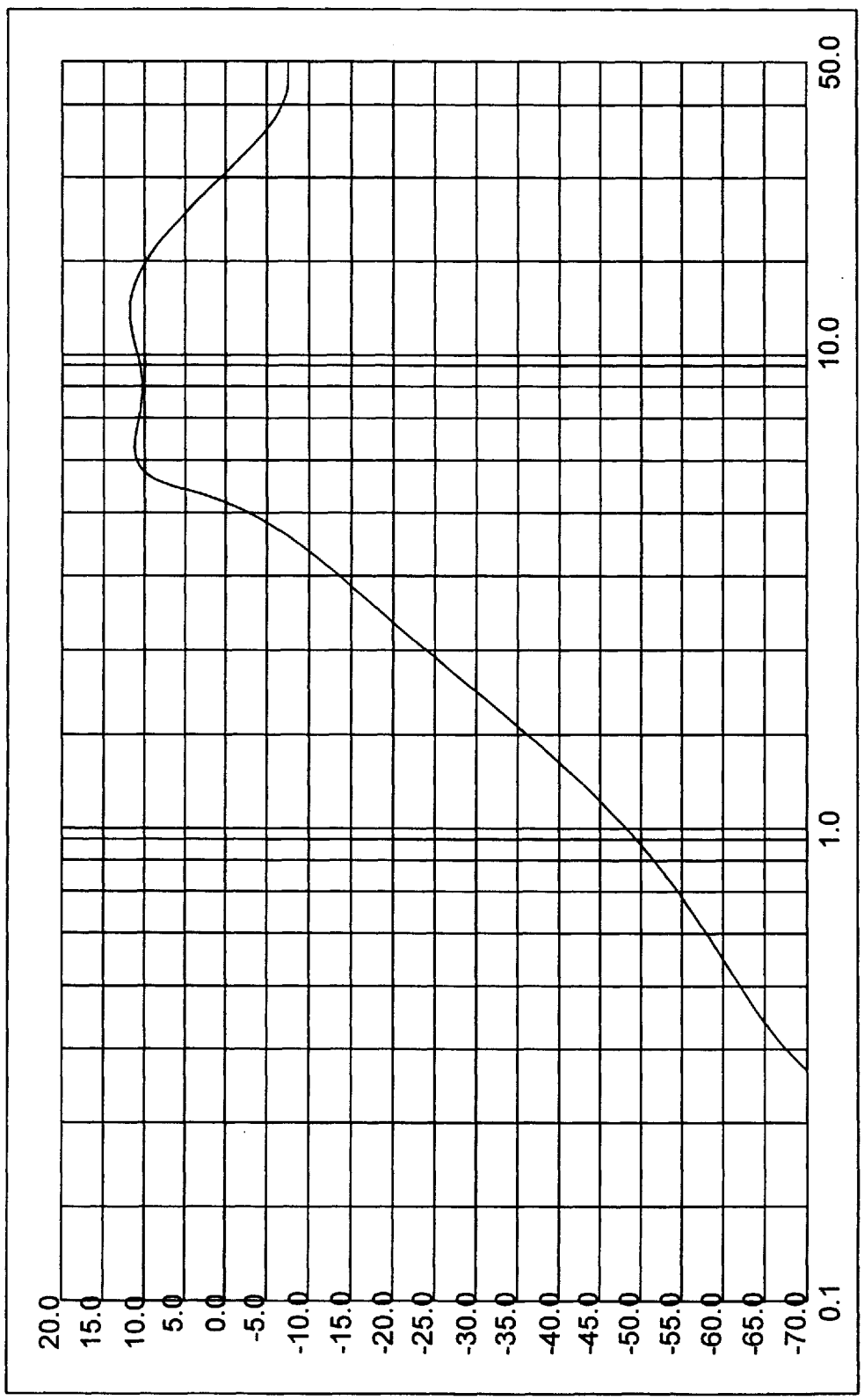
FIG. 2B represents a frequency response of the quantization noise of a D/S modulator.
Figure 3:
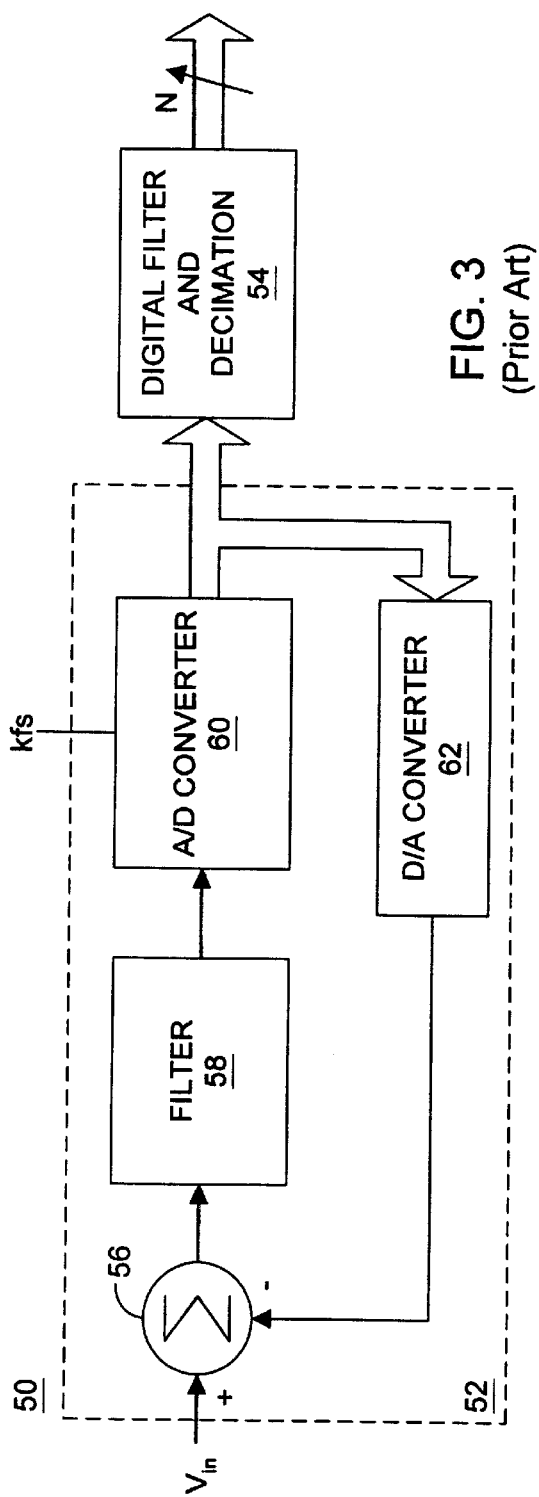
FIG. 3 represents a prior art multi-bit D/S converter in block form.
Figure 5:
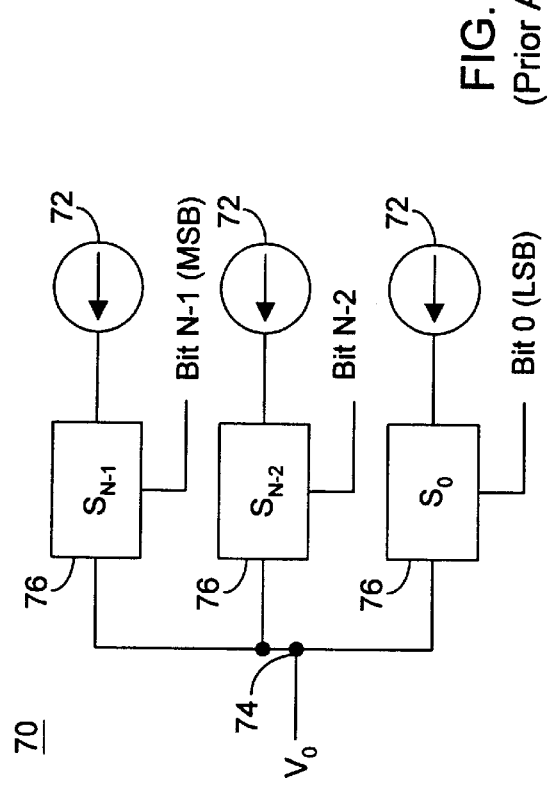
FIG. 5 represents a prior art D/A converter in schematic form.
Figure 4:
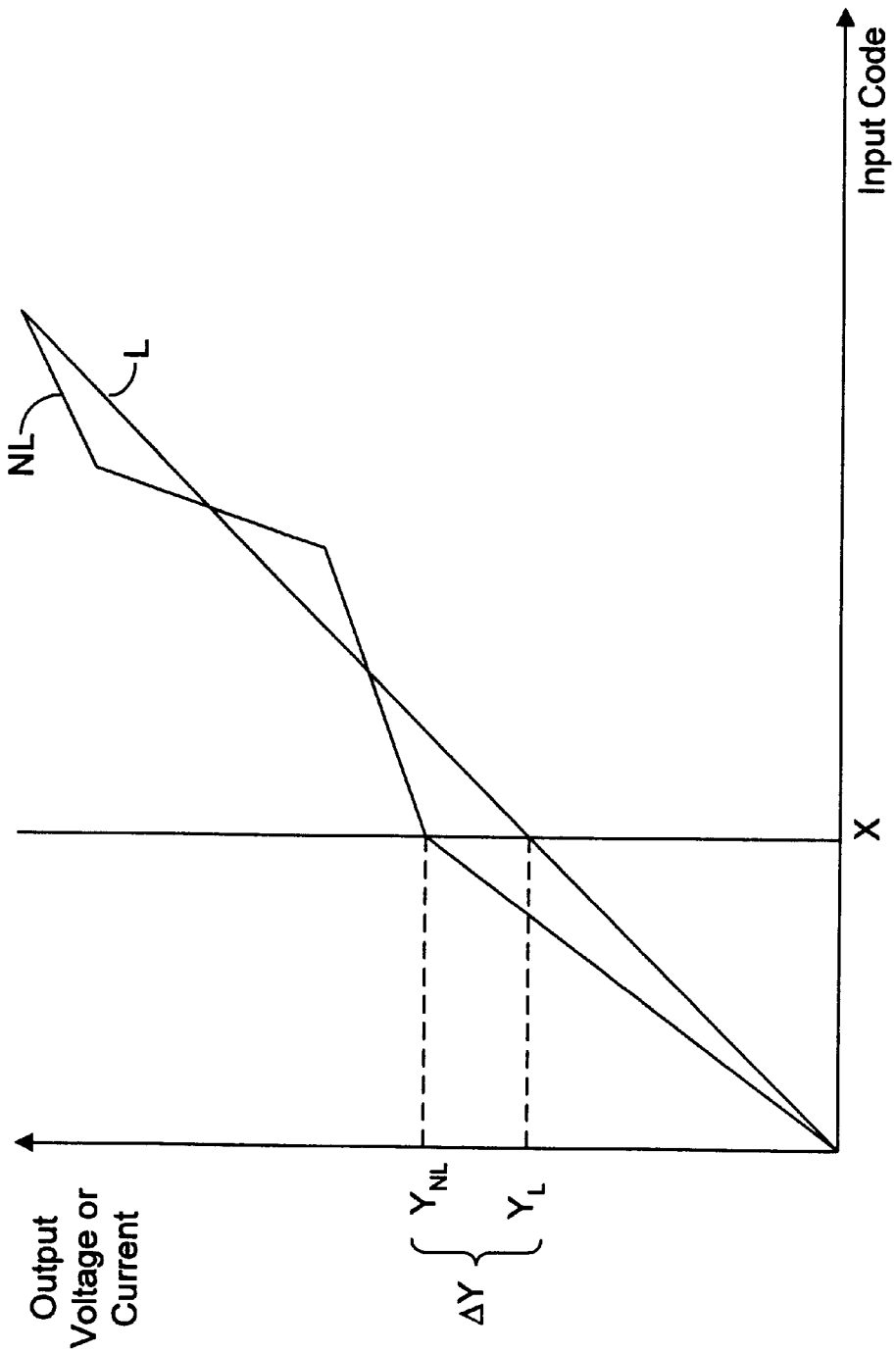
FIG. 4 is a graph representing transfer characteristics of an ideal and a non-ideal multi-bit D/A converter.
Figure 6:
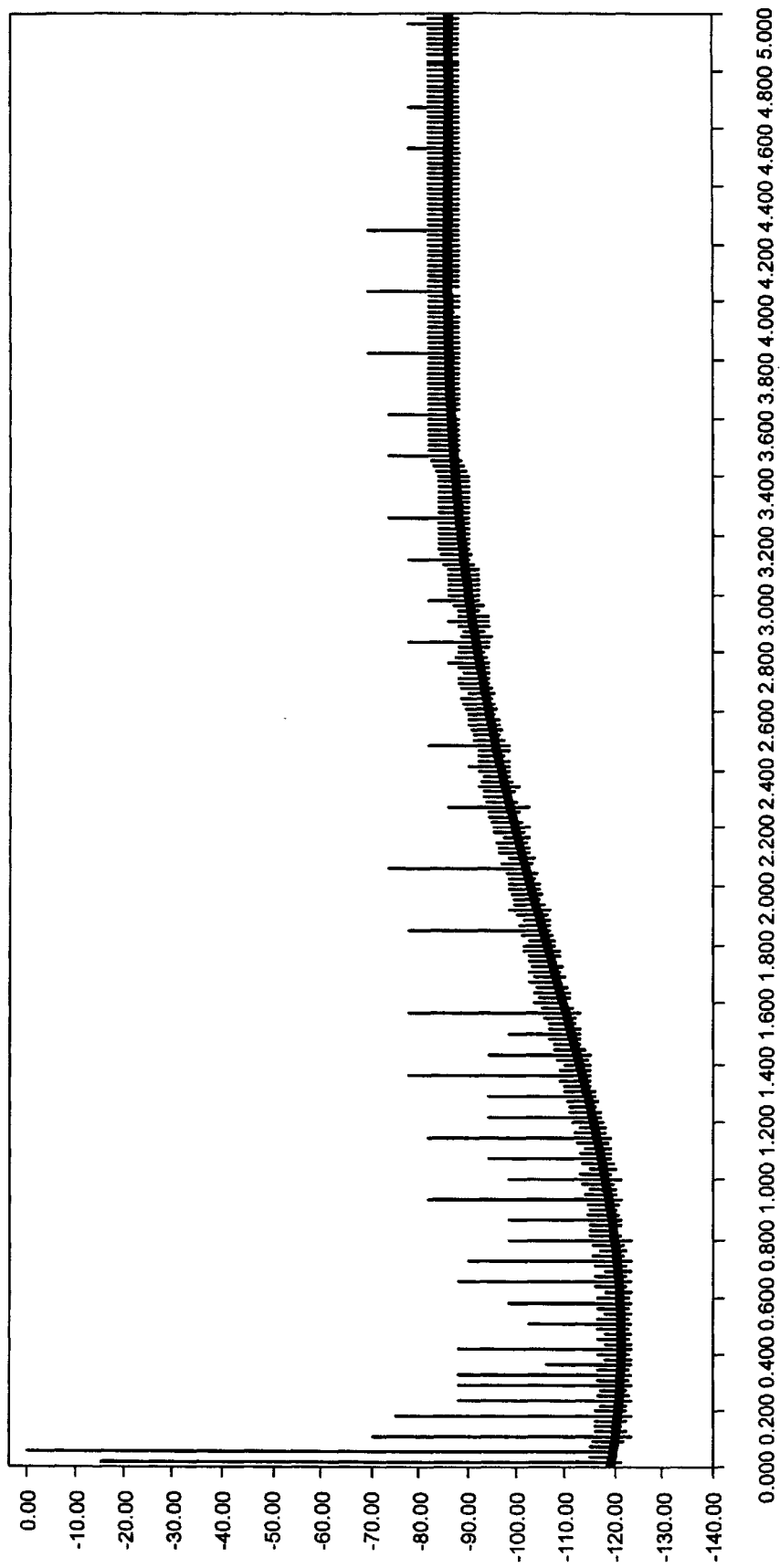
FIG. 6 illustrates the frequency spectrum from a multi-bit D/S converter which has linearity errors.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

Incorporation by Reference

The following are hereby incorporated by reference as though fully and completely set forth herein.

U.S. Pat. No. 5,781,138 titled "System and Method for Generating a Sigma-Delta Correction Circuit" and filed Dec. 23, 1996, whose inventor was Niels Knudsen;

U.S. Pat. No. 5,781,137 titled "System and Method for Reducing Errors in a Delta Sigma Converter" and filed Dec. 23, 1996, whose inventor was Niels Knudsen;

U.S. patent application Ser. No. 09/200,543 titled "System and Method for Generating a Sigma-Delta Correction Circuit" and filed Nov. 25, 1998, whose inventor was Niels Knudsen, U.S. patent application Ser. No. 09/199,937 titled "System and Method for Reducing Errors in a Delta Sigma Converter" and filed Nov. 25, 1998, whose inventor was Niels Knudsen;

U.S. patent application Ser. No. 09/186,314 titled "System and Method for Generating a Sigma-Delta Correction Circuit Using Matrix Calculation of Linearity Error Correction Coefficients" and filed on Nov. 4, 1998, whose inventors were Niels Knudsen and Mark Whittington;

FIG. 7—DAQ System

Figure 7:
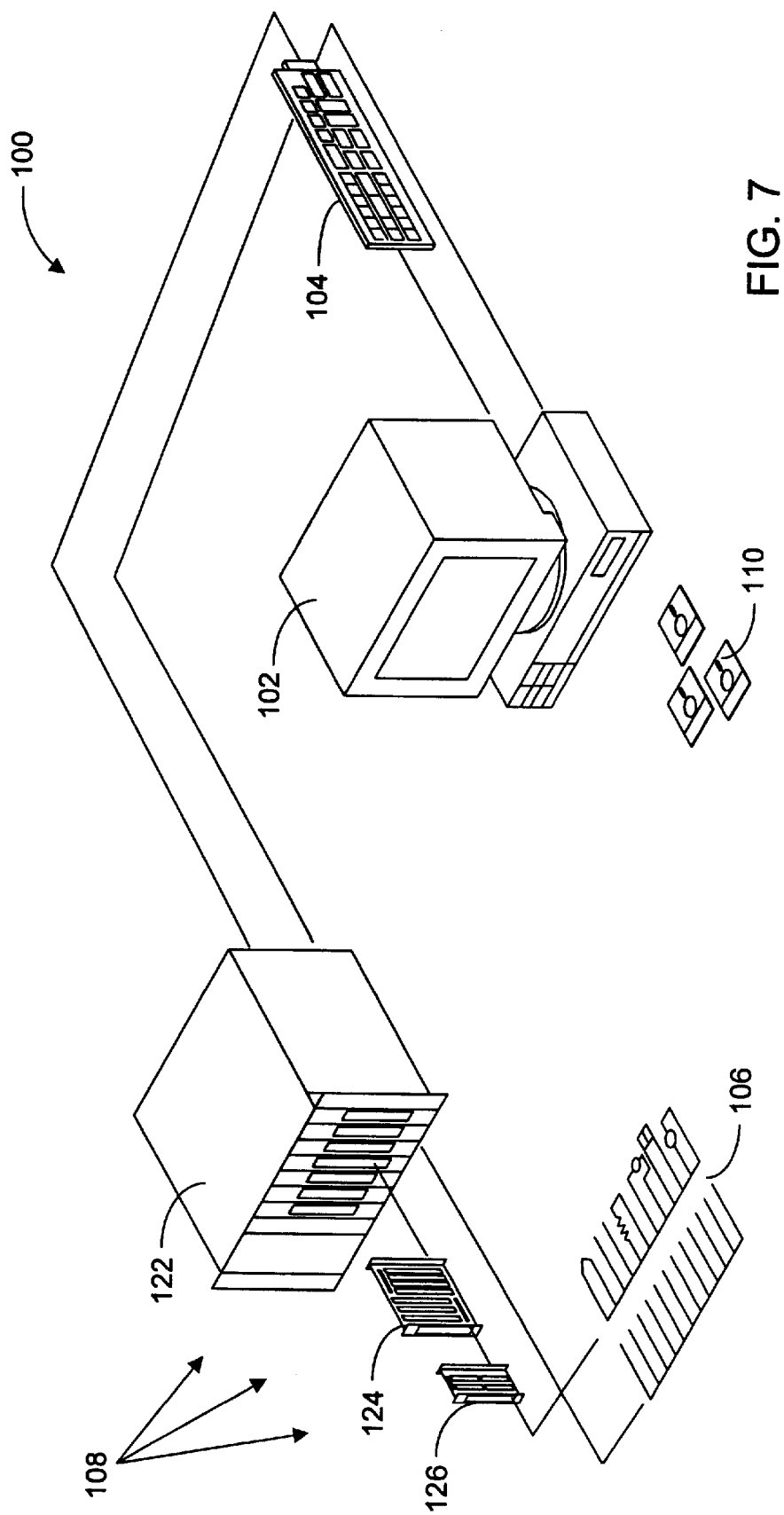
FIG. 7 illustrates a data acquisition (DAQ) data acquisition system which includes the multi-bit A/D converter employing the present invention.

FIG. 7 illustrates a system which includes an analog to digital (A/D) converter employing the present invention. In the preferred embodiment, the present invention is comprised in a data acquisition (DAQ) system. However, the present invention may be included in any of various types of systems where an analog to digital converter is used, i.e., where analog data is converted to digital data. Examples of systems where the present invention may be used include data acquisition systems, instrumentation systems, test and measurement systems, industrial automation systems, process control systems, audio systems, and video acquisition systems, among others.

The present invention may be used with any of various types of A/D converters, including integrating A/D converters, flash A/D converters, sigma-delta A/D converters, sub-ranging A/D converters, and successive approximation A/D converters, among others. The A/D converter includes, for example, one or more internal digital to analog (D/A) converters which may generate linearity errors (also referred to as linear errors). In the following description, the present invention is described with reference to a delta-sigma (also called sigma-delta) A/D converter as one example of the operation of the present invention. The present invention is preferably used with a delta-sigma A/D converter. However, this description does not limit the invention to use with only delta-sigma (D/S) A/D converters, but rather as noted above the present invention may be used with any of various types of A/D converters.

FIG. 7 shows an illustrative DAQ system 100. The system 100 comprises a computer 102, a DAQ device or board 104 coupled to the computer 102, and transducers 106 or other detecting means which provide field electrical signals to the DAQ device 104, optionally through signal conditioning circuitry 108. The DAQ board 104 is preferably comprised in the computer system 102, but is shown external to the computer system 102 for illustrative purposes. The term "data acquisition" used in this specification is intended to encompass data generation as well as data acquisition, one example being with reference to instrumentation and process control systems.

The computer 102 includes various standard components, including at least one central processing unit (CPU), non-volatile memory, such as a hard drive, system memory, one or more buses, and a power supply. The computer 102 preferably includes a memory media, such as a magnetic media, e.g., floppy disk(s) 110, or a CD-ROM, on which computer programs according to the present invention may be stored. The software programs are also stored in the system memory and/or non-volatile memory of the computer 102 and executed by the CPU. The CPU executing code and data from the memory thus comprises a means for configuring and controlling the DAQ device 104 according to the steps described below. In the present disclosure, the terms "memory" or "memory media" are intended to include various types of memory, including installation media such as a CD-ROM, floppy disks 110, or tape drive disks, computer system memory such as DRAM, SRAM, etc., and non-volatile memory such as a magnetic media, e.g., a hard drive, or optical storage, among other types of memory or data storage.

In one embodiment, the computer 102 comprises input/output (I/O) slots into which the DAQ device 104 is coupled. In another embodiment, the computer 102 comprises a VXI (VME Extensions for Instrumentation) chassis and bus, a GPIB (General Purpose Interface Bus), a serial port or parallel port by which the DAQ device 104 is coupled to the computer 102. Examples of computer 102 are IBM-compatible personal computers, Apple Macintosh computers, and Sun Microsystems workstations and operating systems which execute on them.

In one embodiment, the transducers 106 are coupled directly to the DAQ device 104. In another embodiment, the signals received by the transducers 106 are conditioned by the signal conditioning circuitry 108 for presentation to the DAQ device 104 as shown. An example of signal conditioning circuitry 108 is Signal Conditioning Extensions for Instrumentation (SCXI) circuitry. SCXI is an open architecture, multi-channel signal conditioning front-end system for DAQ devices. SCXI comprises an external chassis 122 housing signal conditioning modules 124 and optionally terminal blocks 126 for amplifying, multiplexing, and isolating field signals. The signal conditioning modules advantageously reduce the introduction of noise into the signals transmitted to the DAQ device 104.

The transducers 106 and other detecting means provide the field signals representing a process, physical phenomena, equipment being monitored or measured, etc. to the DAQ device 104. Examples of the transducers 106 are strain gauges, thermocouples, thermistors, photoconductive cells, microphones, and piezoelectric transducers, among others.

Examples of DAQ device 104 are the following products available from National Instruments Corporation: E Series Multifunction I/O boards, such as the AT-MIO-16 series analog input boards, the AT-AO-6/10 series analog output boards, the PC-DIO-96 digital I/O board, and the PC-TIO-10 counter/timer I/O board.

Figure 8:
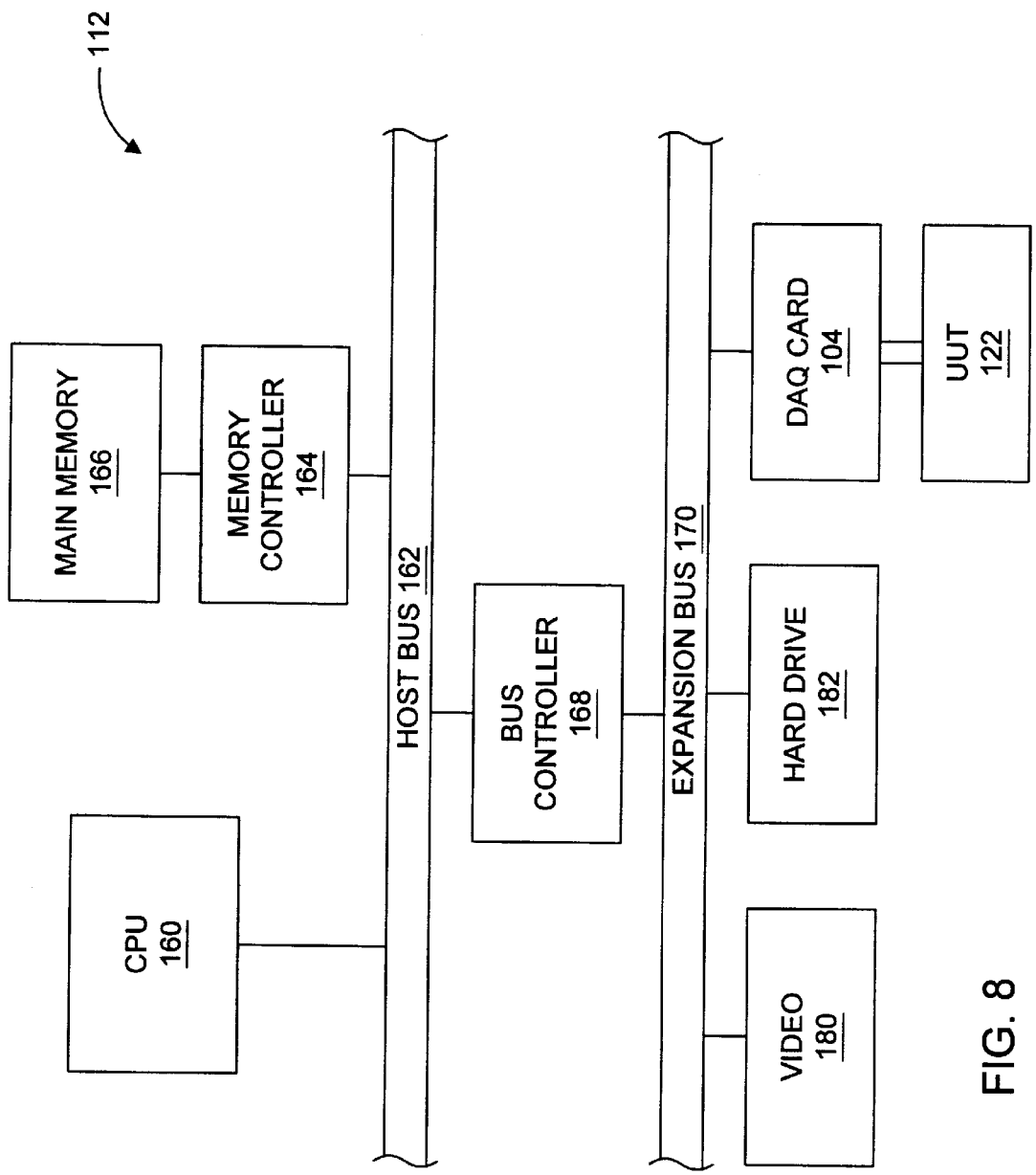
FIG. 8 is a block diagram illustrating the computer system of FIG. 7.

FIG. 8—Computer System Block Diagram

FIG. 8 is a block diagram illustrating an example computer system architecture of the computer system 102 of FIG. 7. FIG. 8 illustrates a representative block diagram of the computer system 102 of FIG. 7, and it is noted that the computer system 102 may have various different architectures, as desired. The elements of a computer system not necessary to understand the operation of the present invention have been omitted for simplicity.

The computer system 102 includes a central processing unit or CPU 160 which is coupled to a processor or host bus 162. The CPU 160 may be any of various types, including an x86 processor such as the Pentium class from Intel, a PowerPC CPU from the Motorola family of processors, as well as others.

Main memory 166, also referred to as system memory 166, is coupled to the host bus 162 by means of memory controller 164. The system memory 166 stores various software used in data acquisition system 100, including DAQ driver level software and a DAQ application. The DAQ driver level software is preferably NI-DAQ software from National Instruments. In the preferred embodiment, the system memory 166 also stores software for configuring the delta-sigma converter comprised on the DAQ card 104. The system memory 166 may store other software, as desired.

Host bus 162 is coupled to an expansion or input/output bus 170 by means of a bus controller 168. The bus controller 168 preferably comprises standard PC chipset logic. The expansion bus 170 is preferably the PCI (Peripheral Component Interconnect) bus, and the bus controller 168 is preferably chipset logic, available from Intel Corporation. The expansion bus 170 includes slots for various devices, including video 180.

A non-volatile memory or hard drive 182 is comprised in the computer system 102 and may be coupled to the expansion bus 170 or to the chipset 168, or to other logic. The non-volatile memory 182 stores an operating system, the DAQ driver software, as well as other application programs, for loading into the system memory 166 as known in the art.

The data acquisition board or device 104 according to the present invention is coupled to the expansion bus 170. The DAQ device 104 is operable to perform communications with an external system or device. The DAQ device 104 is preferably configurable to acquire / generate data from/to an external system or a unit under test. The DAQ device 104 includes the analog to digital (A/D) converter according to the present invention. It is noted that the DAQ device 104 may take various different forms and may be comprised in the computer 102 or external to the computer 102, as desired.

In the preferred embodiment, the present invention is used with a data acquisition system. Thus, as shown, a DAQ interface card 104 is coupled to the expansion bus 170. However, the system and method of the present invention may be used in any of various systems which include an analog to digital converter.

Figure 9:
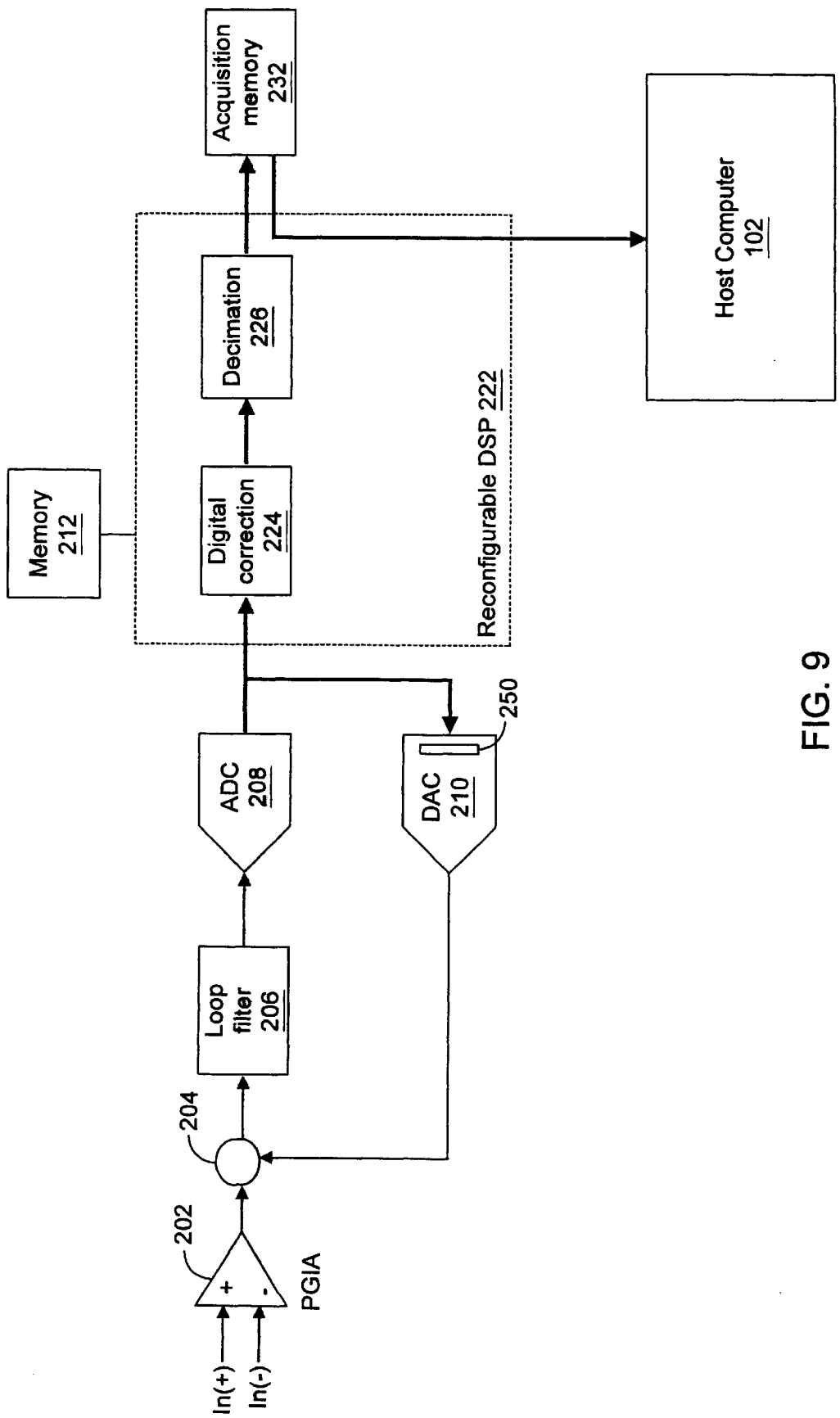

FIG. 9—DAQ Card Block Diagram

FIG. 9 is a block diagram of the DAQ card 104 of FIGS. 7 and 8. More particularly, FIG. 9 shows an example A/D converter, in this case a multi-bit D/S converter, employing the present invention. As noted above, the present invention may be used with any of various types of A/D converters, and in the present description the present invention is described with reference to a delta-sigma A/D converter as one example of the operation of the present invention. However, the present invention readily applies to other types of A/D converters which include internal D/A converters. Circuitry comprised on the DAQ device 104 which is not relevant to the present invention is not shown in FIG. 9 for simplicity.

In addition, the present invention is described with reference to a particular calibration technique for compensating or correcting linearity errors associated with current generators in an A/D converter. However, the present invention readily applies to other calibration techniques for compensating or correcting linearity errors associated with current generators in an A/D converter. Thus the calibration technique disclosed herein is exemplary only.

The DAQ device 104 may include a PGIA (programmable gain instrumentation amplifier) 202 which receives In(+) and In(−) signals. The PGIA couples to the D/S converter of the present invention, which in turn couples to an acquisition memory 232. The acquisition memory is shown coupled to host computer 102. FIG. 9 illustrates normal operation of the DAQ device 104 when acquiring analog waveforms to the host 102 via the acquisition memory 232. Unlike the implementation described in U.S. Pat. Nos. 5,781,137 and 5,781,138, the DAQ device 104 does not require an on-board signal generator, such as a sine wave generator, for use in the calibration. This reduces the cost of the DAQ device 104 while still allowing for advanced calibration techniques to be performed. In the preferred embodiment, the DAQ device 104 includes a logical ground which is used for calibration.

The D/S converter includes a delta sigma modulator, wherein the delta sigma modulator comprises a summing node 204, a loop filter 206, a multi-bit internal A/D converter 208, and a multi-bit D/A converter 210. The D/S converter includes a switching element 250 according to the present invention. The switching element 250 is preferably comprised in the internal D/A converter 210. The operation of the switching element 250 is discussed further below with respect to FIGS. 10 and 10A.

The present invention is shown as being employed in a first order, single pole D/S converter. However, as noted above, the present invention is applicable to other types of D/S or A/D converters.

A linearity error correction circuit 224 and a digital filter and decimation circuit 226, are coupled to the output of the internal A/D converter 208. A processing unit or DSP 222, such as an FPGA (field programmable gate array) or a programmable digital signal processor (DSP), may be coupled to the output of the internal A/D converter 208. When a programmable DSP is used, a memory 212 is coupled to the DSP 222, wherein the DSP 222 executes instructions from the memory. In the preferred embodiment, the processing unit 222 is an FPGA.

Thus, the processing unit 222 operates to perform the digital correction operations of the present invention, preferably through implementation of a look-up table. However, it is noted that the digital correction block 224, also referred to as the linearity error correction circuit or linearity error correction device 224, may be implemented in any of various ways, including a processing unit such as a DSP, CPU, microcontroller, etc., a programmable device such as an FPGA, discrete digital or analog logic, or a combination of the above. In the following discussion, the term "DSP" is used to generally refer to the processing unit 222. The DSP 222 preferably operates to perform both the digital correction operation 224 and the decimation operation 226.

During A/D operation, the D/S modulator comprising summing node 204, loop filter 206, multi-bit internal A/D converter 208, and multi-bit D/A converter 210, performs in substantially the same manner as prior art multi-bit D/S converters. Namely, filter 206 applies a low-pass filter function to the output of summing node 204. The filtered signal in turn is converted into a digital equivalent by A/D converter 208. D/A converter 210 is positioned in a feedback loop between the output of the A/D converter 208 and an input of the summing node 204. Thus, the output of the D/A converter 210 is translated into an analog equivalent which is subtracted from analog input signal $V_{in}$ inputted to summing node 204. Due to the feedback signal provided, the output of the D/A converter 210 approaches that of the input signal if the loop has enough gain.

As shown, the linearity error correction (digital correction) block 224 and the digital filter and decimation block 226 are placed in series between the D/S modulator and the acquisition memory 232. The digital filter and decimation circuit block 226, as implemented by DSP 222, preferably operates substantially in the same way as prior art digital filter and decimation circuits. Namely, the digital filter and decimation block 226 provides low-pass digital filtering and a resampling of the digital signals inputted thereto, where the resampling occurs at a rate $f_s$.

Linearity error (L/E) correction block or circuit 224 is connected to the output of the D/S modulator. Digital signals generated by the D/S modulator are corrected or linearized by the L/E correction circuit 224 before being digitally filtered and decimated. The L/E correction block 224 linearizes the D/S modulator 82 by removing or substantially reducing the linearity errors in output digital signals. The L/E correction block 224 removes or reduces linearity errors by adjusting the output of the D/S modulator to compensate for the linearity error. In particular, in the preferred embodiment the L/E correction circuit 224 utilizes a look-up table to map values output from the D/S modulator which have linearity errors, to new values with reduced linearity errors. Given that the L/E correction circuit 224 linearizes the D/S modulator 82, the D/S converter 80 employing the present invention ultimately produces a digital signal having reduced linearity errors and a higher resolution. Accordingly, the number of bits representing the digital output of the digital filter and decimator 226 can be enhanced or increased.

In one embodiment, a logical ground or other constant analog signal may be selectively coupled to the input of the summing node to provide zero input to the D/S converter for calibration purposes, as discussed further below. Alternatively, a switch may be provided to allow the input of the summing node to "float" with zero input during calibration.

Figure 10:
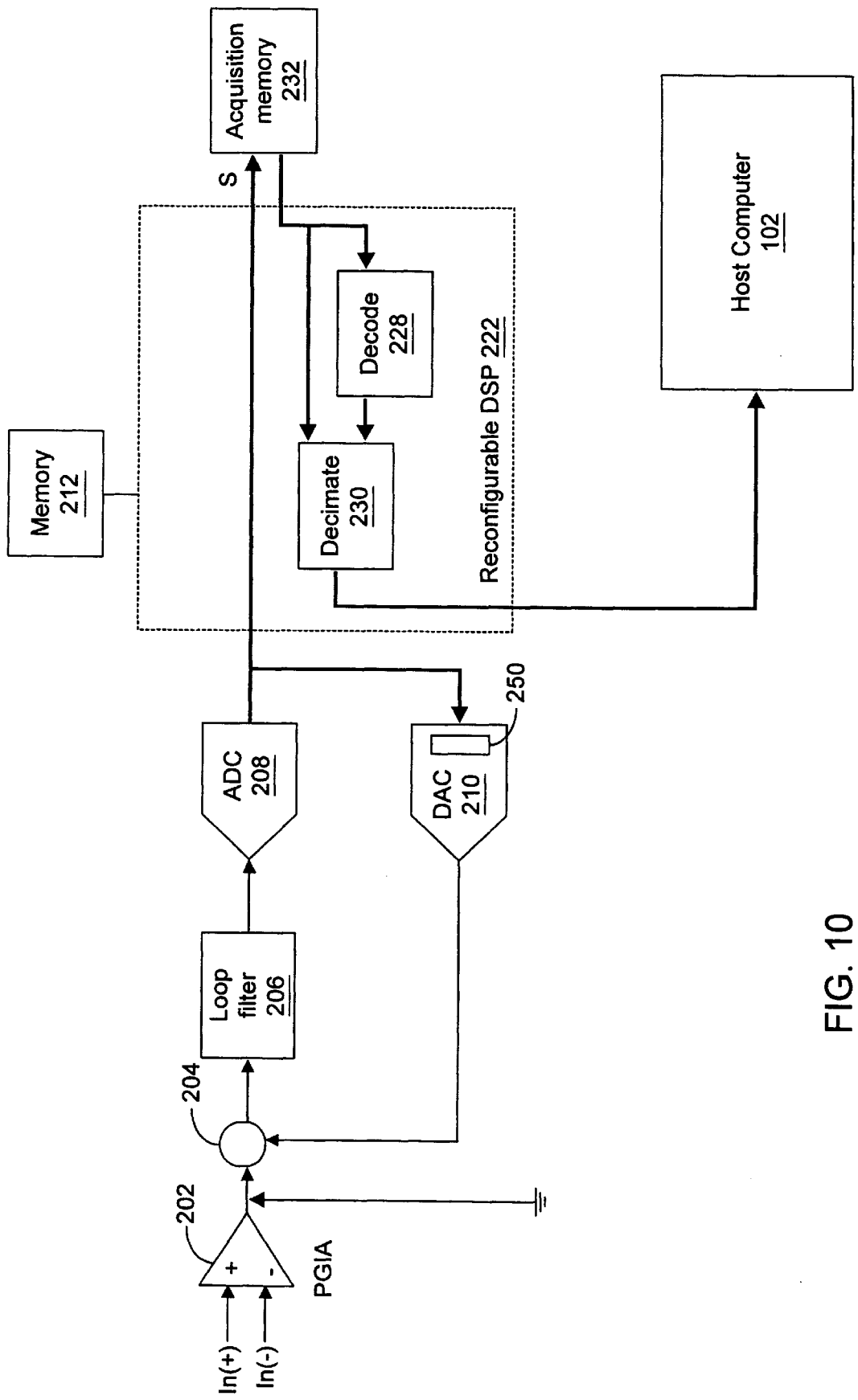
FIG. 10 is a block diagram illustrating the DAQ card configured for calibration according to the present invention.

FIG. 10—D/S Converter Configured for Calibration

FIG. 10 illustrates the D/S converter of FIG. 9, wherein the DSP 222 is configured to perform calibration according to the present invention. During calibration, a fixed or constant analog signal, e.g., a constant voltage or current, preferably a logical ground, may be connected to the input of the summing node 204, as shown. The logical ground operates to provide a constant input, preferably a zero input, to the input of the D/S converter. The D/S converter receives the zero input and generates a plurality of samples S, which are recorded in the acquisition memory 232. In one embodiment, no input is connected to the D/S converter during calibration. In other words, the input of the D/S converter is left floating during calibration. The DAC 210 preferably includes an internal current offset which is approximately one half of the total output current of the DAC 210. Thus, when a logical zero is input to the summing node 204, the internal current offset causes approximately one half of the peak DAC voltage to be provided to the internal ADC 208.

According to the present invention, the switching element 250 operates to selectively connect the inputs of the DAC 210 to different current generators within the DAC 210, thereby causing different current generators to be stimulated for the purpose of calibration. The selective connecting is performed one or more times, preferably a plurality of times, using different switching patterns. Each of the switching patterns produces different connections between the inputs of the internal D/A converter and the respective current generators. Each of the different switching patterns is preferably applied for a certain period of time to ensure proper recording. The different switching patterns ensure that most or all of the current generators within the internal DAC 210 are stimulated. The different switching patterns may involve pre-determined or programmed switching patterns or random switching patterns. If random switching patterns are used, the accuracy is essentially a function of the number of recorded samples obtained.

Thus the switching element 250 operates to adjust connections to a plurality of the current generators in the internal D/A converter a plurality of times, wherein this adjusting of connections causes different ones of the current generators to be stimulated by the input to the A/D converter. Thus the samples S produced by the D/S converter carry linearity error information for most or all of the current generators within the DAC 210.

As noted above, the output samples S are recorded in the acquisition memory 232. In addition, the acquisition memory 232 may also record the different switching patterns used for each recorded sample. For example, the switching element 250 may provide switching pattern information to the acquisition memory 232 as the samples are generated. Alternatively, wherein the switching patterns are generated in a pre-determined manner, the computer 102 may be pre-programmed with the switching patterns. The switching patterns provide an indication of which current generator was stimulated for each output digital signal or sample. This information is used in extracting linearity error information from the recorded samples. As shown, the DSP 222 may be programmed to perform a decimation function 230 on the recorded samples S and provide the decimated samples to the host computer 102 for processing. The DSP 222 may also be programmed to perform a decode function 228 on the recorded samples S to sort the signals into subsets corresponding to each of the current generators comprised in the D/S converter. After the sorting performed by the decode block 228, the decimation block 230 decimates each of the subsets and provides the decimated subsets to the host computer 102 for processing. As discussed below, the host computer 102 operates to extract linearity error information from these received signals. In extracting linearity error information from the recorded signals, the method first removes high frequency noise from the recorded digital signals. The recorded digital signals (with high frequency noise removed) have a frequency band where zero energy is expected, and any signal content present in this band contains hidden linearity error information. The method then operates to extract linearity error information from the recorded digital signals, using the switching patterns to indicate which current generator was stimulated for each output digital signal.

After the computer 102 extracts the linearity error information from the recorded signals, the computer 102 then calibrates the A/D converter using this linearity error information. For example, in one embodiment, the host computer 102 may operate to generate linearity error correction coefficients. The linearity error correction coefficients may then be used to program the DSP 222, i.e., the digital correction block 224, to perform digital correction on the output of the D/S modulator. In the preferred embodiment, the linearity error correction coefficients are then used to generate a look-up table in the memory 212, which is used by the DSP 222 when performing linearity error correction 224.

In an alternate embodiment, a processor located on the DAQ device 104, such as the DSP 222, operates to extract linearity error information from the received signals and in response generate linearity error correction coefficients. Alternatively, a programmable digital analyzer (not shown) external to the DAQ device 104 may be used to perform this function, as desired.

After the calibration operation has been completed, the ground is disconnected from the input of the D/S converter, and the D/S converter is configured as shown in FIG. 9 for data acquisition operations using the newly configured digital correction block 224, i.e., using the configured DSP 222 and memory 212.

FIG. 10A—D/S Converter Configured for Calibration

Figure 10A:
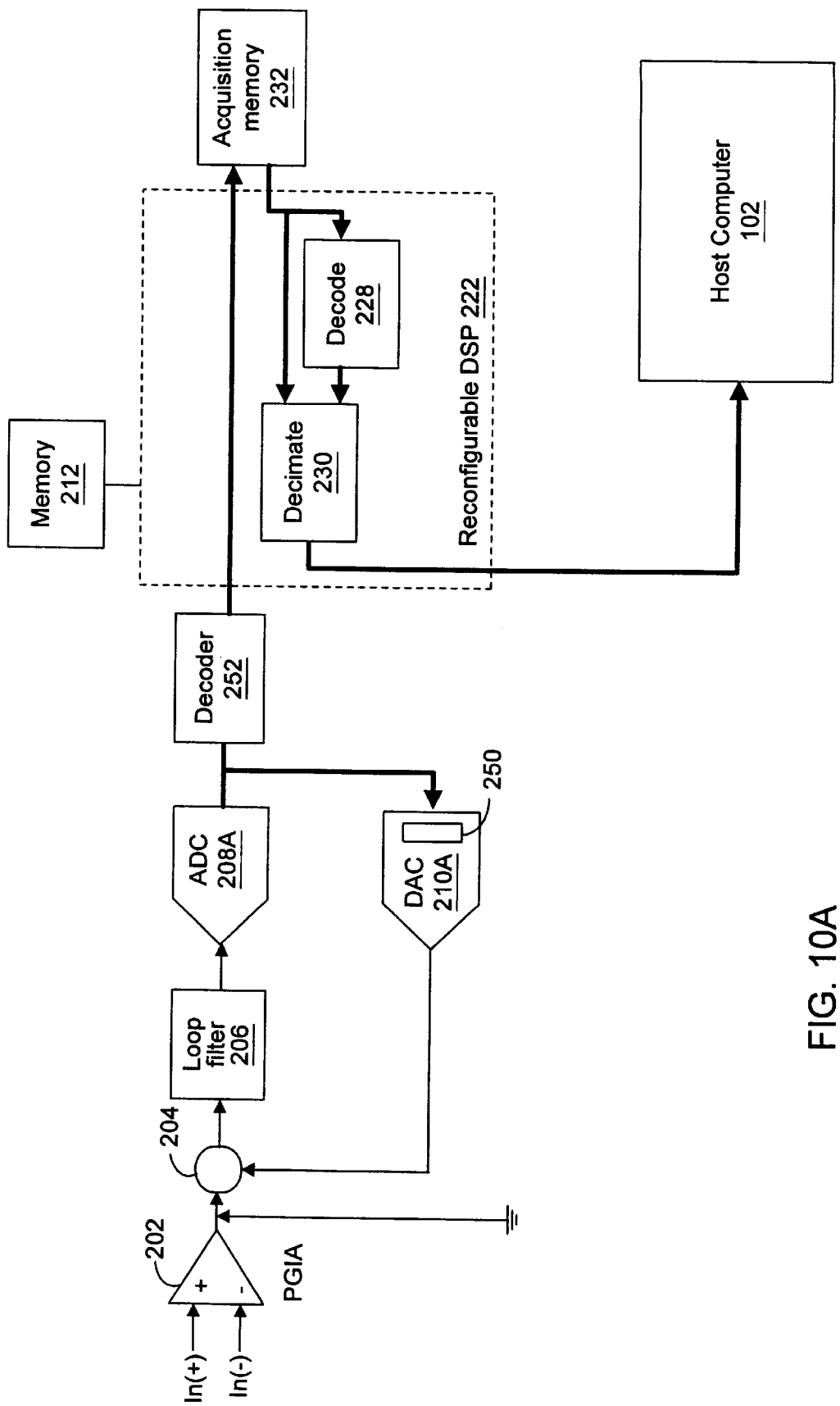
FIG. 10A is a block diagram illustrating the DAQ card configured for calibration according to a preferred embodiment of the present invention.

FIG. 10A illustrates an alternate and preferred embodiment of the D/S converter of FIG. 10. This embodiment is similar to that described in U.S. patent application Ser. No. 09/351,758 titled "Analog-To-Digital Conversion with Reduced Sparkle Codes" and filed Jul. 12, 1999, which is hereby incorporated by reference.

In the embodiment of FIG. 10A, internal ADC 208A and internal DAC 210A differ from the ADC 208 and DAC 210 of FIG. 10. The ADC 208A of FIG. 10A may comprise only comparators, with a corresponding decoder 252 coupled outside of the feedback loop. The DAC 210A may comprise D/A summers, such as summing D/A resistors, and current generators. Thus the ADC 208A does not require an internal decoder, and the DAC 210A does not require an internal encoder.

The output of the comparators in the ADC 208A, referred to as a thermometer code, is provided through switching element 250 to current generators comprised in DAC 210A. The thermometer code is also provided to the decoder 252. Thus, the thermometer code is input into the DAC 210A without any intervening encoder/decoder. Each of the current generators in the DAC 210A preferably receives a respective bit of the output thermometer code. In the embodiment shown in FIG. 10A, the DAC 210A includes one current aerator for each bit in the code to minimize glitch energy in the signal and overcome timing limitations that plague the use of fewer, weighted current generators.

The thermometer code is also input into the decoder 252 directly. The same thermometer code is thus provided to both the decoder 252 and the DAC 210A. The decoder 252 thus decodes the same thermometer code as the DAC 210A to produce the output signal. Thus, in the event of a sparkle code, the DAC 210A and the decoder 252 handle the error in the same way, and the error is suppressed due to the loop gain factor.

In the embodiment of FIG. 10A, the redundant decode and encode functions are removed from the ADC 208A and DAC 210A, respectively. The D/S converter of FIG. 10A may thus have reduced latency by avoiding redundant A/D and D/A operations, while reducing the amount of glitch energy inside the feedback loop.

In the embodiment of FIG. 10A, the switching element 250 may be comprised in the DAC 210A. The switching element 250 may also be outside of the DAC 210A or comprised in the ADC 208A. The switching element 250 operates to receive the thermometer code output from the comparators in ADC 208A and selectively provide the bits of the thermometer code to different ones of the summers/current generators. The switching element 250 operates to provide bits of the thermometer code to different ones of the summers/current generators according to different switching patterns. As discussed above, this operates to stimulate different ones of the current generators during calibration when a constant input is being provided to the A/D converter.

FIG. 11—Switching Element

FIG. 11 illustrates the switching element 250 according to the present invention. As shown, the switching element 250 receives a digital code as an input, wherein the digital code is output from the ADC 208 (or 208A). In the embodiment of FIG. 10A, the digital code output from the ADC 208A is a thermometer code generated by a plurality of comparators comprised in the ADC 208A. The digital code or thermometer code comprises a plurality of bits corresponding to the analog input to the ADC 208 (or 208A).

The switching element 250 receives the bits comprising the digital code and selectively provides the bits to different current generators 260. The switching element 250 preferably provides bits to the different current generators 260 according to different switching patterns. This selective provision of bits to the current generators 260 may occur in a predetermined or random manner. In other words, the switching patterns may be pre-programmed or random. The switching element 250 operates to selectively provides the bits to different current generators a plurality of times (a plurality of switching patterns) to ensure that a majority or all of the current generators 260 are stimulated by the input being received by the A/D converter. Thus, the switching element 250 operates to selectively provides the bits to the current generators 260 according to a first switching pattern, and then, at a later time period, the switching element 250 operates to selectively provide the bits to the current generators 260 according to a second switching pattern, and so on.

FIG. 11A illustrates an example of the switching element 250 providing the bits to the current generators 260 according to a first switching pattern, and FIG. 11B illustrates an example of the switching element 250 providing the bits to the current generators 260 according to a second switching pattern. As shown, the switching element 250 is operable to connect the bits of the digital code received at its inputs to different current generators over time during calibration.

Thus the switching element 250 dynamically reconfigures itself according to different switching patterns to provide the bits of the digital code to different current generators 260 each time. As an example, bit 1 of the digital code may be provided to current generator 35 for a first period of time, current generator 23 for a second period of time, current generator 57 for a third period of time, and so on.

The switching element 250 preferably comprises combinatorial or state machine logic, but may also comprise other types of logic, such as an FPGA.

Figure 12:
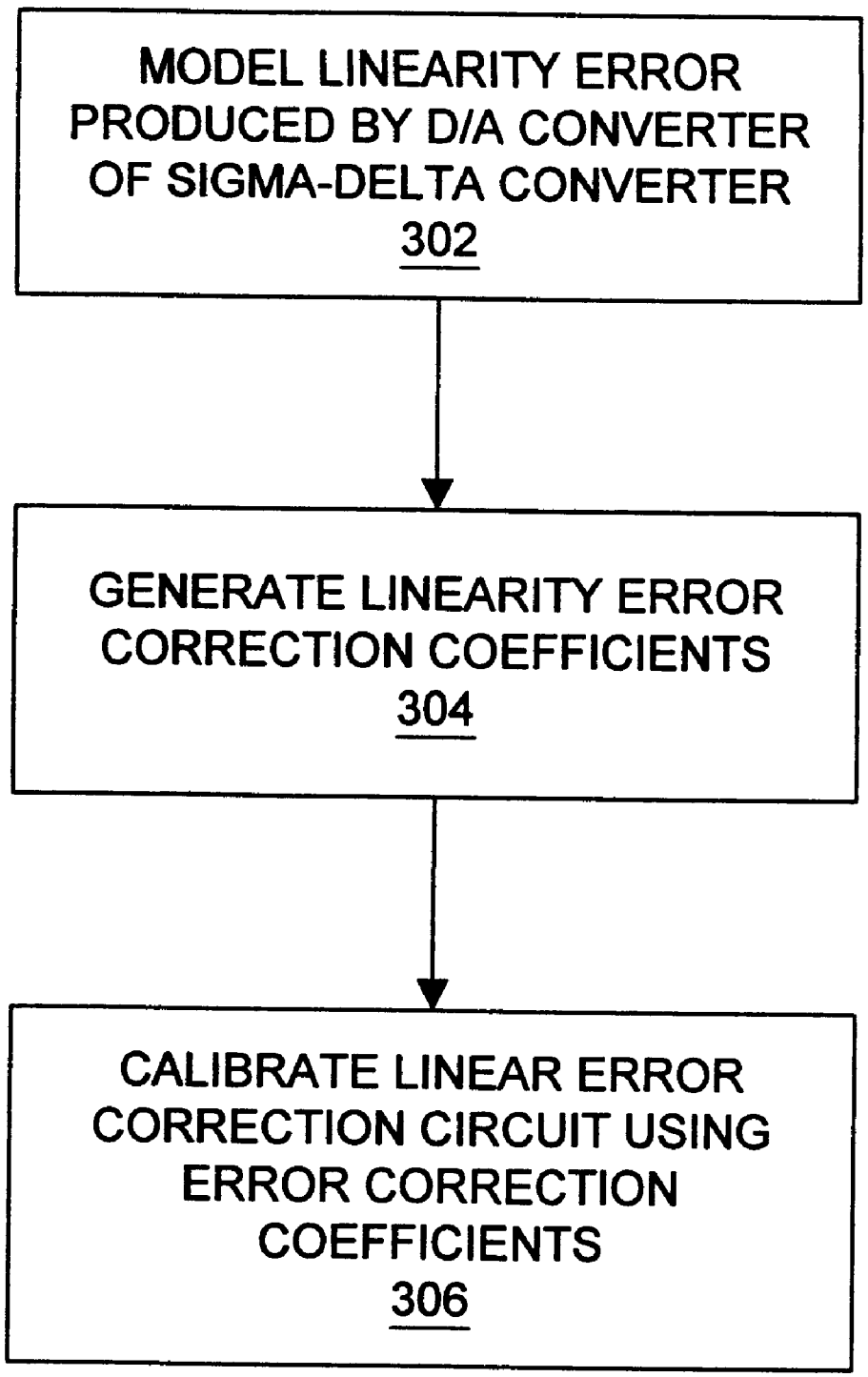
FIG. 12 is a top level flowchart which illustrates the method of the present invention.

FIG. 12—Top Level Flowchart

FIG. 12 shows, in general terms, application of the present invention to a conventional multi-bit D/S converter. As mentioned above, the present invention is described with reference to the calibration method disclosed in U.S. Pat. Nos. 5,781,137 and 5,781,138. However, the present invention may be used with any of various calibration methods, as desired.

In step 302 the DSP 222 and/or host computer 102 model the linearity error inherent in the D/A converter 210 (or 210A). The linearity error modeling performed in step 302 produces linearity error information associated with the D/A converter 210. The linearity error information contains information corresponding to active states of the current generators internal to the D/A converter in the A/D converter. The linearity error modeling performed in step 302 is shown in more detail in FIG. 13.

Based on the linearity error modeling, the host computer 102 generates correction coefficients in step 304. Thus, in the preferred embodiment, the host computer 102 generates the correction coefficients in software. However, it is noted that the correction coefficients may be generated by the board 104, either in hardware or software, or by a combination of the DAQ device 104 and host computer 102, or by an external system.

Thereafter, in step 306, the linearity error correction coefficients are used to configure or calibrate the L/E correction circuit 224 comprised on the board 104. In the preferred embodiment, as discussed above, the DSP 222 implements the L/E correction circuit 224.

Once the L/E correction circuit 224, i.e., the DSP 222, is properly configured, the delta sigma converter may be used for analog to digital conversion. Thus, as shown in FIG. 9, an input voltage $V_{in}$ is applied to the delta-sigma converter input summing node 204, $V_{in}$ is digitally sampled, and the digital samples are provided to the DSP 222 for L/E correction. The DSP 222 in turn translates the digital samples into values with reduced linearity errors.

Figure 13:
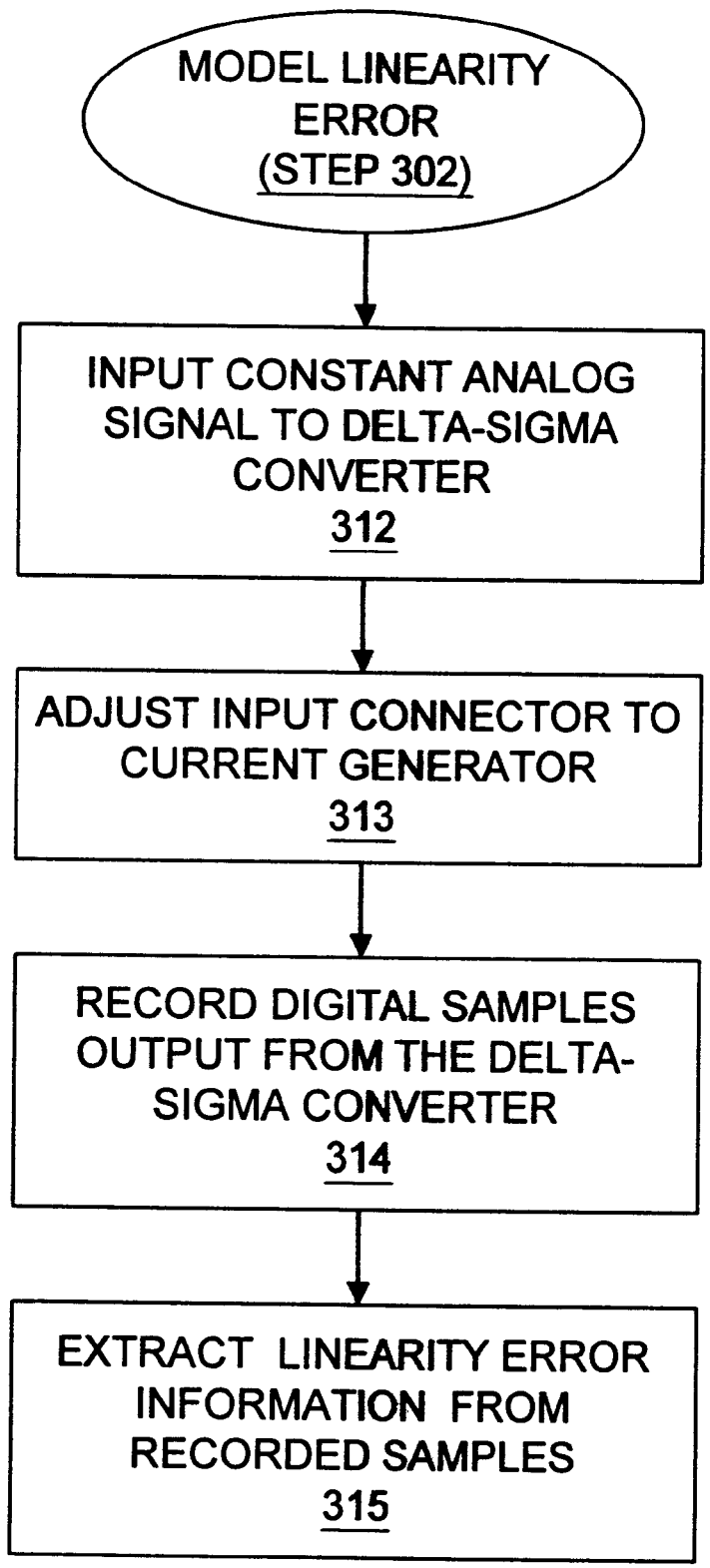
FIG. 13 is a more detailed flowchart diagram illustrating how linearity errors are modeled or extracted according to the method of the present invention.

FIG. 13—Modeling of Linearity Errors.

With continuing reference to FIGS. 10 and 10A, FIG. 13 illustrates operation of step 302 of FIG. 12, i.e., FIG. 13 illustrates modeling of linearity errors performed in step 302 of FIG. 12.

As shown, in step 312 a constant analog signal may be input to the D/S modulator. This is accomplished by selectively connecting a constant analog source, such as a constant voltage source, e.g., logical ground, to the input of summing node 204, as shown in FIGS. 10 and 10A. During calibration, the input to the D/S modulator is preferably a logical ground, although other types of constant voltages/currents may be used. It is noted that any of various analog sources may be used during calibration. The switching element 250 comprised in the internal DAC 210/210A allows a much simpler analog input to be used during calibration while still enabling each of the current generators in the internal DAC 210 (or 210A) to be stimulated by the input.

In step 313 the switching element 250 operates to adjust the connections to the current generators in the DAC 210 or 210A to cause different ones of the current generators to be stimulated. The switching element 250 thus is operable to selectively or randomly adjust the connections to the current generators in the DAC 210 or 210A to cause different ones of the current generators to be stimulated by the constant input. As discussed above, the switching element 250 utilizes one or more different switching patterns to cause different ones of the current generators to be stimulated by the constant input.

In step 314 the acquisition memory 232 collects and stores a set S of digital samples of the output by the D/S modulator. Here it is noted that digital correction 224 and decimation 226 are not performed on the output of the D/S modulator, but rather the digital samples are recorded directly in the acquisition memory 232. The acquisition memory 232 may also store the switching pattern used in generating each recorded sample. This switching pattern information is used in determining which current generator was stimulated during generation of a respective output digital signal or sample.

The digital samples output from the D/S converter are preferably continuously recorded in step 314. During the continuous recording performed in step 314, the switching element 250 operates to adjust the connections to the current generators in the DAC 210 (or 210A) one or more times according to different switching patterns to cause different ones of the current generators to be stimulated.

Stated another way, steps 313 and 314 are performed a plurality of times to ensure that a majority or all of the current generators are stimulated. Thus, step 313 is performed a plurality of times, wherein the switching element 250 operates to adjust the connections to the current generators in the DAC 210 or 210A a plurality of times to stimulate different ones of the current generators. This ensures that a majority or all of the current generators are stimulated. Step 314 is also performed a plurality of times to ensure that the digital samples are recorded.

After the set S of digital samples or digital signals are recorded in step 314, and the corresponding switching patterns are recorded in step 314, in step 315 linearity error information is extracted. Step 315 may be performed by the host computer 102 or by onboard DSP 222. The linearity error information may be extracted in many ways. In one embodiment, high frequency noise is first removed from the samples. The recorded digital signals (with high frequency noise removed) have a frequency band where zero energy is expected, and any signal content present in this band contains hidden linearity error information. The method then operates to extract linearity error information from the recorded digital signals, using the switching patterns to indicate which current generator was stimulated for each output digital signal.

In the preferred embodiment, step 315 is performed as follows. First, a net linearity error E is extracted from the recorded samples. This may be accomplished by preferably first decimating the recorded digital signals, which operates to prevent unwanted spectral leakage from high frequencies into low frequencies. Alternatively, a Hanning window may be applied to the recorded digital signals. The method then preferably transforms the resulting digital signals into the frequency domain using a frequency domain transform algorithm such as a Fast Fourier Transform (FFT) algorithm. The resulting spectrum ideally should be zero at low frequencies, except for components at certain frequencies including those at D.C. However, because the A/D converter is non-ideal, other frequency components of the spectrum are non-zero. These unexpected, non-zero components are caused by non-linearities inherent in the A/D converter in general and internal generators in the internal D/A converter in particular.

A net linearity error spectral content or spectrum, which represents an accumulation of specific non-linearities of the delta-sigma modulator in the frequency domain, is extracted by removing those frequency components which are expected to be non-zero, i.e.: (1) the D.C. component; (2) the components at higher frequencies containing quantization noise; and (3) components at bins mirrored around the half sampling rate. Thereafter, an inverse frequency domain transform algorithm is applied to the remaining spectrum, resulting in a net linearity error in the time domain and designated as E. The net linearity error E is a column vector with each element representing an accumulation of individual linearity errors inherent in each individual generator in the D/A converter. The net linearity error is one portion of the hidden information used in the preferred embodiment to derive the correction coefficients.

Linearity errors associated with the individual generators are also determined in the preferred embodiment to derive the correction coefficients. These linearity errors are preferably isolated by first sorting or decoding the recorded digital signals into subsets. Each value in a subset corresponds to an active state of one of the generators internal to the D/A modulator. Thus the recorded digital signals and the corresponding switching patterns are analyzed, and for each digital sample in the recorded digital signal, the method determines which current generator(s) were active for that sample. Thus the sorting or decoding produces a subset for each current generator, wherein the polarity of the values in the subset indicate the active/inactive state of the current generator for the corresponding samples in the recorded digital signals.

The individual linearity errors, or specific linearity errors, are obtained by subjecting each subset of digital signals to the above procedure. In other words, for each respective subset, a decimation is performed, and/or a Hanning window is applied. After this, a frequency domain transform is applied to the respective subset to generate a frequency domain equivalent. A specific linearity error spectral content or spectrum is extracted from the resulting spectrum by removing therefrom those components at frequencies which are expected to be non-zero, i.e., removing one or more of: (1) the D.C. component; (2) the components at higher frequencies containing quantization noise; and (3) components at bins mirrored around the half sampling rate. A specific linearity error, designated by the column vector a(m), is then generated by applying an inverse FFT to the remaining spectrum. The integer index m identifies the particular current generator. The above procedure is performed for each subset, thereby generating a specific linearity error a(m) corresponding to each individual current generator.

Thus the above method produces linearity error information comprising a net linearity error E and specific linearity errors a(m).

The linearity error information contains information on linearity errors associated with a majority or all of the current generators. The linearity error information contains information corresponding to active states of the current generators internal to the D/A converter in the A/D converter.

The linearity error information may then be used to generate linearity error correction coefficients in step 304 and calibrate or configure the linearity error correction circuit in step 306.

In performing 304 of FIG. 12, the linearity error correction coefficients c(m) may be generated as a function of E and a(m). In one embodiment, the coefficients c(m) are generated by iteratively minimizing a power content between the net linearity error E and the specific linearity errors a(m). In an alternative embodiment, the linearity error correction coefficients c(m) are calculated as a function of the net linearity error spectrum and the specific linearity error spectrums. This embodiment eliminates the need to convert the net linearity error spectrum and the specific linearity error spectrums into the time domain.

In the currently preferred embodiment, the coefficients c(m) are generated by computing the matrix equation:

$$c = (A^T A)^{-1}(A^T E)$$

where c is a column vector with entries comprising the correction coefficients c(m), A is a matrix with columns comprising the specific linearity subsets a(m), and E is the column vector of net linearity error. If there are S samples after decimation and n current generators, vector c has n-1 elements, since one of the current generators is presumed to be ideal, matrix A has S rows and n-1 columns, and vector E has S elements. The particular linear combination of a(m) that most closely equals E, in the least square sense, is given by the coefficient vector c as defined in the above matrix equation.

Once the coefficients are calculated, in step 306 the linearity error correction circuit may then be configured. The linearity error correction circuit preferably comprises a look-up table which maps digital values output from the A/D converter to new, enhanced values which have reduced linearity errors. The new digital values are calculated as a function of the linearity error correction coefficients c(m). In the preferred embodiment, a respective new digital value is calculated by summing the respective digital value output from the A/D converter with the correction coefficients c(m) corresponding to current generators which are active in producing the respective digital value output from the A/D converter.

The look-up table or correction circuit, once configured, is connected to the output of the A/D converter, e.g., a delta sigma modulator of a delta-sigma converter. For example, in one embodiment, the A/D converter is a delta-sigma converter which comprises a delta-sigma modulator that includes a summing node, a loop filter, a multi-bit internal A/D, a multi-bit D/A converter and the linearity error correction circuit, preferably a look-up table. The summing node is connected to an analog input signal. The filter applies a low pass function to the output of the summing node. The filtered signal is then converted into a digital equivalent by A/D converter. The D/A converter is positioned in a feedback loop between the output of the A/D converter and an input of the summing node. Thus, the output of the A/D converter is translated into an analog equivalent and then subtracted from the connected analog input signal at the summing node. Due to the feed-back signal provided, the output of the D/A converter approaches that of the inputted analog signal, if the loop has enough gain. The linearity error correction circuit or look-up table is connected to the output of the A/D converter. The look-up table operates by translating the digital signal output of the A/D converter into an enhanced digital signal, i.e., a digital signal with reduced linearity error.

The preferred operation of extracting linearity error information in step 315, and the preferred operations of generating linearity error correction coefficients in step 304 and calibrating or configuring the linearity error correction circuit in step 306 are discussed in U.S. Pat. Nos. 5,781,137 and 5,781,138, which were incorporated by reference above. The present invention may also be used with other calibration techniques, as desired.

Dynamic Re-calibration

The current generators contained within the internal D/A converter 210 may vary with time and temperature. Accordingly, the linearity error associated thereto may likewise vary over time and temperature. Thus, the L/E circuit 224 may be recalibrated over time and use, in order to account for changing linearity errors. In other words, the L/E circuit 224 may be dynamically recalibrated during use. To recalibrate, the above method is performed, and the host computer 102 generates a new set of correction coefficients c(m) and reconfigures the L/E correction circuit 224 in accordance thereto. In this manner, the resolution of the D/S converter can be maximized throughout its use.

Numerous variations and modifications will become apparent to those skilled in the art once the above disclosure is fully appreciated. It is intended that the following claims be interpreted to embrace all such variations and modifications.

What is claimed is:

1. A method for calibrating an analog to digital (A/D) converter, wherein the A/D converter includes an internal D/A converter, wherein the internal D/A converter includes a plurality of current generators, wherein one or more of the current generators produces linearity errors in the A/D converter, the method comprising:

adjusting connections to a plurality of the current generators in the internal D/A converter, wherein said adjusting connections causes different ones of the current generators to be stimulated by an input to the A/D converter;

recording a plurality of output digital signals from the A/D converter after said adjusting connections;

generating linearity error information from the recorded plurality of output digital signals;

calculating linearity error correction coefficients as a function of the linearity error information; and configuring a linear error correction circuit using the calculated linearity error correction coefficients;

wherein the linear error correction circuit is operable to be coupled to or comprised in the A/D converter, wherein the linear error correction circuit is operable to receive output digital signals from the A/D converter and generate new output digital signals with reduced linearity errors.

2. The method of claim 1, wherein said adjusting connections comprises adjusting connections to a plurality of the current generators a plurality of times according to a plurality of different switching patterns, thereby causing different ones of the current generators to be stimulated by the input to the A/D converter.

3. The method of claim 2, wherein the internal D/A converter includes a switching element, wherein the switching element operates to perform said adjusting connections to cause bits of an input digital code to be provided to different ones of the current generators in the internal D/A converter.

4. The method of claim 3, further comprising:

the switching element receiving the bits of the input digital code;

the switching element providing said bits to the current generators in the internal D/A converter according to a switching pattern;

wherein the switching element receiving the bits and the switching element providing said bits to the current generators are performed for each of the plurality of switching patterns, thereby causing different ones of the current generators to be stimulated by the input to the AID converter.

5. The method of claim 2, wherein the plurality of switching patterns are preprogrammed.

6. The method of claim 2, wherein the plurality of switching patterns are randomly generated.

7. The method of claim 1, further comprising;

repeating said adjusting connections and said recording the plurality of output digital signals one or more times, thereby causing different ones of the current generators to be stimulated by the input to the A/D converter.

8. The method of claim 1, wherein the A/D converter also includes an internal A/D converter, the method further comprising:

the A/D converter receiving an input analog signal;

the internal A/D converter receiving the input analog signal;

the internal A/D converter outputting an output digital code corresponding to the input analog signal, wherein the output digital code comprises a plurality of bits;

the internal D/A converter receiving the output digital code;

wherein said adjusting connections results in bits of said output digital code being provided to different ones of the current generators in the internal D/A converter, thereby stimulating different ones of the current generators;

repeating said steps of receiving the input analog signal, outputting the output digital code, receiving the output digital code, and said adjusting connections a plurality of times to stimulate a plurality of the current generators.

9. The method of claim 8, wherein the internal D/A converter includes a switching element, wherein the switching element operates to perform said adjusting connections to cause bits of said output digital code to be provided to different ones of the current generators in the internal D/A converter.

10. The method of claim 1, further comprising:

providing an input analog signal as the input to the A/D converter;

wherein said adjusting connections and said recording the plurality of output digital signals are performed during said providing the input analog signal;

wherein said adjusting connections causes different ones of the current generators to be stimulated by the input analog signal to the A/D converter.

11. The method of claim 10, wherein the input analog signal is a constant value.

12. The method of claim 10, wherein the input analog signal is a logical ground.

13. The method of claim 1, wherein no input is applied to the A/D converter during said adjusting connections and said recording.

14. The method of claim 1, wherein each of said linearity error correction coefficients corresponds to a particular active state of one of the current generators internal to the D/A converter in the A/D converter.

15. The method of claim 1, wherein said linearity error information includes information corresponding to active states of the current generators comprised in the internal D/A converter in the A/D converter.

16. The method of claim 1, wherein the A/D converter comprises a delta sigma analog to digital converter.

17. The method of claim 16, wherein the AID converter comprises a delta sigma modulator;

wherein the linear error correction circuit is operable to be coupled to an output of the delta sigma modulator, wherein the linear error correction circuit is operable to receive output digital signals from the delta sigma modulator and generate new output digital signals with reduced linearity errors.

18. A method for generating linearity error information for use in calibrating an analog to digital (A/D) converter, wherein the A/D converter includes an internal D/A converter, wherein the internal D/A converter includes a plurality of current generators, wherein one or more of the current generators produces linearity errors in the A/D converter, the method comprising:

adjusting connections to a plurality of the current generators in the internal D/A converter, wherein said adjusting connections causes different ones of the current generators to be stimulated by an input to the A/D converter;

recording a plurality of output digital signals from the AID converter after said adjusting connections;

repeating said adjusting connections and said recording the plurality of output digital signals one or more times, thereby causing a plurality of the current generators to be stimulated by the input to the A/D converter;

generating linearity error information from the recorded plurality of output digital signals;

calculating linearity error correction coefficients as a function of the linearity error information; and configuring a linear error correction circuit using the calculated linearity error correction coefficients;

wherein the linear error correction circuit is operable to be coupled to or comprised in the A/D converter, wherein the linear error correction circuit is operable to receive output digital signals from the A/D converter and generate new output digital signals with reduced linearity errors.

19. The method of claim 18, wherein said adjusting connections comprises adjusting connections to a plurality of the current generators a plurality of times according to a plurality of different switching patterns, thereby causing different ones of the current generators to be stimulated by the input to the A/D converter.

20. The method of claim 19, wherein the internal D/A converter includes a switching element, wherein the switching element operates to perform said adjusting connections to cause bits of an input digital code to be provided to different ones of the current generators in the internal D/A converter.

21. The method of claim 19, further comprising:
the switching element receiving the bits of the input digital code; and
the switching element providing said bits to the current generators in the internal D/A converter according to a switching pattern;
wherein the switching element receiving the bits and the switching element providing said bits to the current generators are performed for each of the plurality of switching patterns, thereby causing different ones of the current generators to be stimulated by the input to the A/D converter.

22. The method of claim 18, wherein the A/D converter also includes an internal AID converter, the method further comprising:
the A/D converter receiving an input analog signal;
the internal A/D converter receiving the input analog signal;
the internal A/D converter outputting an output digital code corresponding to the input analog signal, wherein the output digital code comprises a plurality of bits;
the internal D/A converter receiving the output digital code;
wherein said adjusting connections results in bits of said output digital code being provided to different ones of the current generators in the internal D/A converter, thereby stimulating different ones of the current generators;
repeating said steps of receiving the input analog signal, outputting the output digital code, receiving the output digital code, and said adjusting connections a plurality of times to stimulate a plurality of the current generators.

23. The method of claim 18, further comprising:
connecting a constant analog input signal to an input of the A/D converter;
wherein said adjusting connections and said recording the plurality of output digital signals are performed after said connecting.

24. A system for generating a linearity error correction device for use in an A/D converter, wherein the A/D converter includes an internal D/A converter, wherein the internal D/A converter includes a plurality of current generators, wherein one or more of the current generators produces linearity errors in the A/D converter, wherein the A/D converter generates output digital signals representative of an input received by the A/D converter, the system comprising:

a switching device comprised in the A/D converter, wherein the switching device is operable to adjust connections to a plurality of the current generators in the internal D/A converter, wherein said adjusting connections causes different ones of the current generators to be stimulated by an input to the A/D converter;
a first memory connected to the A/D converter for storing the plurality of output digital signals representative of the input received by the A/D converter; and
a computer system, coupled to the first memory and to the linearity error correction device, wherein the computer is operable to generate linearity error information from the plurality of the output digital signals, wherein the computer system is operable to calculate linearity error correction coefficients as a function of the linearity error information, wherein the computer is operable to configure the linearity error correction device using the calculated linearity error correction coefficients;
wherein the linear error correction circuit is operable to be coupled to or comprised in the A/D converter, wherein the linear error correction circuit is operable to receive output digital signals from the A/D converter and generate new output digital signals with reduced linearity errors.

25. The system of claim 24, wherein the switching device is operable to adjust connections to a plurality of the current generators a plurality of times according to a plurality of different switching patterns, thereby causing different ones of the current generators to be stimulated by the input to the A/D converter.

26. The system of claim 25, wherein the switching element is operable to adjust connections to cause bits of an input digital code to be provided to different ones of the current generators in the internal D/A converter according to the plurality of different switching patterns.

27. The system of claim 25, wherein the A/D converter also includes an internal A/D converter, the method further comprising:
wherein the internal A/D converter outputs an output digital code corresponding to an input analog signal provided to the A/D converter, wherein the output digital code comprises a plurality of bits;
wherein the switching device is operable to receive the output digital code, wherein the switching device provides bits of said output digital code to different ones of the current generators in the internal D/A converter according to the plurality of different switching patterns, thereby stimulating different ones of the current generators.

28. The system of claim 27, further comprising:
a constant analog signal source which is connectable to the input of the A/D converter during calibration to provide the input analog signal to the A/D converter, wherein the input analog signal is a constant value.

29. The system of claim 27, further comprising:
a logical ground which is connectable to the input of the A/D converter during calibration, wherein the input analog signal is a logical ground.

30. The system of claim 25, wherein the plurality of switching patterns are pre-programmed.

31. The system of claim 25, wherein the plurality of switching patterns are randomly generated.

32. The system of claim 24, wherein the switching device is comprised in the internal D/A converter.

33. The system of claim 24, wherein the A/D converter is a sigma delta analog to digital converter.

34. The system of claim 24, wherein said linearity error information includes information corresponding to active states of the current generators internal to the D/A converter in the A/D converter.

35. A method for constructing a linearity error correction device for use in an analog to digital (A/D) converter, wherein the A/D converter includes an internal D/A converter, wherein the internal D/A converter includes a plurality of current generators, wherein one or more of the current generators produces linearity errors in the A/D converter, the method comprising:

adjusting connections to a plurality of the current generators in the internal D/A converter, wherein said adjusting connections causes different ones of the current generators to be stimulated by an input to the A/D converter;

recording a plurality of output digital signals from the A/D converter after said adjusting connections;

generating linearity error information from the recorded plurality of output digital signals; and constructing the linearity error correction device using said linearity error information;

wherein the linearity error correction device is useable to correct linearity errors in the A/D converter.

36. The method of claim 35, wherein said adjusting connections comprises adjusting connections to a plurality of the current generators a plurality of times according to a plurality of different switching patterns, thereby causing different ones of the current generators to be stimulated by the input to the A/D converter.

37. The method of claim 36, wherein the internal D/A converter includes a switching element, wherein the switching element operates to perform said adjusting connections to cause bits of an input digital code to be provided to different ones of the current generators in the internal D/A converter.

38. The method of claim 37, further comprising:

the switching element receiving the bits of the input digital code;

the switching element providing said bits to the current generators in the internal D/A converter according to a switching pattern;

wherein the switching element receiving the bits and the switching element providing said bits to the current generators are performed for each of the plurality of switching patterns, thereby causing different ones of the current generators to be stimulated by the input to the A/D converter.

39. The method of claim 36, wherein the plurality of switching patterns are pre-programmed.

40. The method of claim 36, wherein the plurality of switching patterns are randomly generated.

41. The method of claim 35, further comprising;

repeating said adjusting connections and said recording the plurality of output digital signals one or more times, thereby causing different ones of the current generators to be stimulated by the input to the A/D converter.

42. The method of claim 35, wherein the A/D converter also includes an internal A/D converter, the method further comprising:

the A/D converter receiving an input analog signal;

the internal A/D converter receiving the input analog signal;

the internal A/D converter outputting an output digital code corresponding to the input analog signal, wherein the output digital code comprises a plurality of bits;

the internal D/A converter receiving the output digital code;

wherein said adjusting connections results in bits of said output digital code being provided to different ones of the current generators in the internal D/A converter, thereby stimulating different ones of the current generators;

repeating said steps of receiving the input analog signal, outputting the output digital code, receiving the output digital code, and said adjusting connections a plurality of times to stimulate a plurality of the current generators.

43. The method of claim 42, wherein the internal D/A converter includes a switching element, wherein the switching element operates to perform said adjusting connections to cause bits of said output digital code to be provided to different ones of the current generators in the internal D/A converter.

44. The method of claim 35, further comprising calculating linearity error correction coefficients c(m) in response to the linearity error information; and wherein said constructing constructs the linearity error correction device using said linearity error correction coefficients c(m).

45. The method of claim 44, wherein said constructing the linearity error correction device comprises:

generating a plurality of first digital values from the linearity error correction coefficients c(m);

constructing said linearity error correction device using said plurality of first digital values.

46. The method of claim 45, wherein said constructing said linearity error correction device comprises configuring a look-up table including said plurality of first digital values;

wherein said plurality of first digital values are addressable by an output of the A/D converter.

47. The method of claim 46, wherein the A/D converter is operable to convert an input analog signal into an output digital value, wherein the output digital value includes linearity errors;

wherein the linearity error correction device is operable to translate the output digital value into one of said plurality of first digital values, where said one of said plurality of first digital values has reduced linearity errors when compared to the linearity errors in the output digital value.

48. The method of claim 44, wherein each of said linearity error correction coefficients c(m) corresponds to a particular active state of a generator internal to the internal D/A converter in the A/D converter.

* * * * *

UNITED STATES PATENT AND TRADEMARK OFFICE
CERTIFICATE OF CORRECTION

PATENT NO.    : 6,232,897 B1
DATED         : May 15, 2001
INVENTOR(S)   : Niels Knudsen Page 1 of 1

It is certified that error appears in the above-identified patent and that said Letters Patent is hereby corrected as shown below:

<u>Title page,</u>
Item [75], the inventor's name should be spelled Niels Knudsen. Please change Knusen to -- Knudsen --.

<u>Column 19, claim 4,</u>
Line 36, please delete "AID" and substitute -- A/D --.

<u>Column 20, claim 17,</u>
Line 35, please delete "AID" and substitute -- A/D --.

<u>Column 20, claim 18,</u>
Line 56, please delete "AID" and substitute -- A/D --.

<u>Column 21, claim 21,</u>
Line 19, please delete "claim 19" and substitute -- claim 20 --.

<u>Column 21, claim 22,</u>
Line 32, please delete "AID" and substitute -- A/D --.

Signed and Sealed this

Thirteenth Day of November, 2001

Attest:

NICHOLAS P. GODICI
*Attesting Officer*   *Acting Director of the United States Patent and Trademark Office*